United States Patent
Lunt, III et al.

(10) Patent No.: US 11,688,818 B2
(45) Date of Patent: Jun. 27, 2023

(54) TRANSPARENT ENERGY-HARVESTING DEVICES

(71) Applicant: Board of Trustees of Michigan State University, East Lansing, MI (US)

(72) Inventors: Richard R. Lunt, III, Williamston, MI (US); Yimu Zhao, East Lansing, MI (US)

(73) Assignee: Board of Trustees of Michigan State University, East Lansing, MI (US)

(*) Notice: Subject to any disclaimer, the term of this patent is extended or adjusted under 35 U.S.C. 154(b) by 0 days.

(21) Appl. No.: 16/697,762

(22) Filed: Nov. 27, 2019

(65) Prior Publication Data

US 2020/0098942 A1 Mar. 26, 2020

Related U.S. Application Data

(63) Continuation of application No. 14/220,850, filed on Mar. 20, 2014, now Pat. No. 10,510,914.

(60) Provisional application No. 61/947,187, filed on Mar. 3, 2014, provisional application No. 61/804,053, filed on Mar. 21, 2013.

(51) Int. Cl.
| | |
|---|---|
| *H01L 31/055* | (2014.01) |
| *H01L 31/048* | (2014.01) |
| *H01L 31/054* | (2014.01) |
| *H02S 40/22* | (2014.01) |

(52) U.S. Cl.
CPC .......... *H01L 31/055* (2013.01); *H01L 31/048* (2013.01); *H01L 31/0547* (2014.12); *H02S 40/22* (2014.12); *Y02E 10/52* (2013.01)

(58) Field of Classification Search
CPC .................. H01L 31/00–078; Y02E 10/50–60

USPC .................................................. 136/243–265
See application file for complete search history.

(56) References Cited

U.S. PATENT DOCUMENTS

| | | | |
|---|---|---|---|
| 4,155,371 | A | 5/1979 | Wohlmut et al. |
| 4,159,212 | A | 6/1979 | Yerkes |
| 4,357,486 | A | 11/1982 | Blieden et al. |
| 2003/0227517 | A1 | 12/2003 | Yaron |
| 2006/0112983 | A1 | 6/2006 | Parce et al. |
| 2007/0116628 | A1 | 5/2007 | Shew et al. |
| 2007/0297988 | A1* | 12/2007 | Wu ..................... A61K 49/0093 424/9.6 |

(Continued)

FOREIGN PATENT DOCUMENTS

| | | |
|---|---|---|
| CN | 103534831 A | 1/2014 |
| EP | 2693503 A1 | 2/2014 |

(Continued)

OTHER PUBLICATIONS

TW201115763 English Translation (Year: 2011).*

(Continued)

*Primary Examiner* — Bach T Dinh
(74) *Attorney, Agent, or Firm* — Harness, Dickey & Pierce, PLC

(57) ABSTRACT

An energy harvesting system is provided. The energy harvesting system includes a waveguide, a luminophore embedded in the waveguide, and a solar photovoltaic array or a solar photovoltaic cell coupled to the waveguide. The energy harvesting system is visibly transparent, having an average visible transmittance of greater than about 50% and a color rendering index of greater than about 80 at normal incidence to the waveguide.

20 Claims, 14 Drawing Sheets

(56) References Cited

U.S. PATENT DOCUMENTS

| | | | |
|---|---|---|---|
| 2008/0072960 A1 | 3/2008 | Kim et al. | |
| 2009/0027872 A1 | 1/2009 | Debije et al. | |
| 2009/0032083 A1 | 2/2009 | Torrance et al. | |
| 2009/0056791 A1 | 3/2009 | Pfenninger et al. | |
| 2009/0159801 A1 | 6/2009 | Knapp et al. | |
| 2009/0229652 A1 | 9/2009 | Mapel et al. | |
| 2010/0139749 A1* | 6/2010 | Mapel | H01L 31/0547 136/255 |
| 2010/0288352 A1 | 11/2010 | Ji et al. | |
| 2010/0326496 A1 | 12/2010 | Bhattacharya et al. | |
| 2011/0063392 A1 | 3/2011 | Wu et al. | |
| 2011/0086302 A1 | 4/2011 | Zhou et al. | |
| 2011/0232211 A1 | 9/2011 | Farahi | |
| 2012/0186623 A1 | 7/2012 | Bulovic et al. | |
| 2013/0104983 A1 | 5/2013 | Abrams et al. | |
| 2013/0174896 A1 | 7/2013 | Ardo et al. | |
| 2013/0230464 A1 | 9/2013 | Yi et al. | |
| 2013/0333755 A1 | 12/2013 | Lunt et al. | |
| 2014/0018425 A1 | 1/2014 | Hsu et al. | |
| 2014/0130864 A1 | 5/2014 | Lunt et al. | |

FOREIGN PATENT DOCUMENTS

| | | | |
|---|---|---|---|
| JP | 2001076877 A | | 3/2001 |
| JP | 2002108259 A | | 4/2002 |
| JP | 2003269317 A | | 9/2003 |
| JP | 2004252304 A | | 9/2004 |
| JP | 2005503453 A | | 2/2005 |
| JP | 2005-136531 | | 5/2005 |
| JP | 2009512122 A | | 3/2009 |
| JP | 2010258020 A | | 11/2010 |
| JP | 2011505479 A | | 2/2011 |
| JP | 2012510717 A | | 5/2012 |
| JP | 2012532135 A | | 12/2012 |
| JP | 2013109076 A | | 6/2013 |
| JP | 2013526008 A | | 6/2013 |
| JP | 2013529372 A | | 7/2013 |
| JP | 2013187349 A | | 9/2013 |
| JP | 2013535799 A | | 9/2013 |
| JP | 2014505370 A | | 2/2014 |
| JP | 2014049631 A | | 3/2014 |
| TW | 201115763 | * | 5/2011 |
| WO | WO-2004084272 A2 | | 9/2004 |
| WO | WO-2007035466 A2 | | 3/2007 |
| WO | WO-2009002943 A2 | | 12/2008 |
| WO | WO-2009011188 A1 | | 1/2009 |
| WO | WO-2009091773 A2 | | 7/2009 |
| WO | WO-2011074295 A1 | | 6/2011 |
| WO | WO-2011158568 A1 | | 12/2011 |
| WO | WO 2013/003894 | | 1/2013 |
| WO | WO-2013003890 A1 | | 1/2013 |
| WO | WO-2013167224 A1 | | 11/2013 |
| WO | WO-2013171517 A1 | | 11/2013 |

OTHER PUBLICATIONS

International Search Report regarding International Application No. PCT/US2015/021257, dated Jun. 25, 2015.
Written Opinion of the International Searching Authority regarding International Application No. PCT/US2015/021257, dated Jun. 25, 2015.
International Preliminary Report on Patentability regarding International Application No. PCT/US2015/021257, dated Sep. 20, 2016.
Office Action regarding Chinese Patent Application No. 201580015157.4, dated Jul. 20, 2017. Translation provided by Shanghai Beshining Law Office.
Search Report regarding European Patent Application No. 15764966.6, dated Nov. 20, 2017.
Office Action regarding European Patent Application No. 15764966.6, dated Jul. 16, 2018.
Office Action regarding Japanese Patent Application No. 2017-501095, dated Feb. 19, 2019. Translation provided by Harakenzo World Patent and Trademark.
Office Action regarding Japanese Patent Application No. 2017-501095, dated Jul. 16, 2019. Translation provided by Harakenzo World Patent and Trademark.
Office Action regarding European Patent Application No. 15764966.6, dated Sep. 27, 2019.
Barnham, Keith et al., "Quantum-dot concentrator and thermodynamic model for the global redshift." Applied Physics Letters, vol. 76, No. 9, pp. 1197-1199 (2000).
Batchelder, J. S. et al., "Luminescent solar concentrators. 1: Theory of operation and techniques for performance evaluation." Applied Optics, vol. 18, No. 18, pp. 3090-3110 (1979).
Batchelder, J. S. et al., "Luminescent solar concentrators. 2: Experimental and theoretical analysis of their possible efficiencies." Applied Optics, vol. 20, No. 21, pp. 3733-3754 (1981).
Bertolino, Chiara A. et al., "Novel Heptamethine Cyanine Dyes with Large Stokes' Shift for Biological Applications in the Near Infrared." Journal of Fluorescence, vol. 16, No. 2, pp. 221-225 (2006).
Bos, Francis, "Optimization of spectral coverage in an eight-cell oscillator-amplifier dye laser pumped at 308 nm." Applied Optics, vol. 20, No. 20, pp. 3553-3556 (1981).
Casida, Mark E. et al., "Molecular excitation energies to high-lying bound states from time-dependent density-functional response theory: Characterization and correction of the time-dependent local density approximation ionization threshold." Journal of Chemical Physics, vol. 108, No. 11, pp. 4439-4449 (1998).
Chatten, A. J. et al., "A new approach to modelling quantum dot concentrators." Solar Energy Materials and Solar Cells, vol. 75, No. 3-4, pp. 363-371 (2003).
Chen, Chun-Chao et al., "Visibly Transparent Polymer Solar Cells Produced by Solution Processing." ACS Nano, vol. 6, No. 8, pp. 7185-7190 (2012).
Currie, Michael J. et al., "High-Efficiency Organic Solar Concentrators for Photovoltaics." Science, vol. 321, No. 5886, pp. 226-228 (2008).
Debije, Michael G. et al., "Thirty Years of Luminescent Solar Concentrator Research: Solar Energy for the Built Environment." Advanced Energy Materials, vol. 2, pp. 12-35 (2012).
Decker, C. David, "Excited state absorption and laser emission from infrared laser dyes optically pumped at 532 nm." Applied Physics Letters, vol. 27, No. 11, pp. 607-609 (1975).
Dunning Jr., Thom H., "Gaussian basis sets for use in correlated molecular calculations. I. The atoms boron through neon and hydrogen." Journal of Chemical Physics, vol. 90, No. 2, pp. 1007-1023 (1989).
Escobedo, Jorge O. et al., "NIR dyes for bioimaging applications." Current Opinion in Chemical Biology, vol. 14, pp. 64-70 (2010).
Exciton, "LDS 730." Retrieved from: <www.exciton.com/pdfs/lds730.pdf>.
Fischer, Georg M. et al., "Pyrrolopyrrole Cyanine Dyes: A New Class of Near-Infrared Dyes and Fluorophores." Chemistry—A European Journal, vol. 15, No. 19, pp. 4857-4864 (2009).
Galluzzi, F. et al., "Spectrum shifting of sunlight by luminescent sheets: Performance evaluation of photovoltaic applications." Solar Energy, vol. 33, No. 6, pp. 501-507 (1984).
Gao, Dangli et al., "Codopant ion-induced tunable upconversion emission in $\beta$-NaYF$_4$:Yb$^{3+}$/Tm$^{3+}$nanorods." Dalton Transactions, vol. 42, No. 5, pp. 1834-1841 (2013).
Goetzberger, A. et al., "Solar Energy Conversion with Fluorescent Collectors." Applied Physics, vol. 14, pp. 123-139 (1977).
Goldschmidt, Jan Christoph et al., "Increasing the efficiency of fluorescent concentrator systems." Solar Energy Materials and Solar Cells, vol. 93, No. 2, pp. 176-182 (2009).
Gross, E. K. U. et al., "Local Density-Functional Theory of Frequency-Dependent Linear Response." Physical Review Letters, vol. 55, No. 26, pp. 2850-2852 (1985).
Hirata, So et al., "Time-dependent density functional theory within the Tamm-Dancoff approximation." Chemical Physics Letters, vol. 314, No. 3-4, pp. 291-299 (1999).

(56) References Cited

OTHER PUBLICATIONS

Iles, P.A., "Non-solar photovoltaic cells." Proceedings of the 21st IEEE Conference on Photovoltaic Specialists, vol. 1, pp. 420-425 (1990).
Jacquemin, Denis et al., "Assessment of the efficiency of long-range corrected functionals for some properties of large compounds." Journal of Chemical Physics, vol. 126, No. 14, pp. 144105-1-144105-12 (2007).
Knorr, Fritz J. et al., "Investigation of Solvent Isotope Effects on Raman and Fluorescence Intensity of LDS750 in $CH_3OH$ and $CD_3OD$." Journal of Physical Chemistry A, vol. 104, No. 42, pp. 9494-9499 (2000).
Kohn, W. et al., "Self-Consistent Equations Including Exchange and Correlation Effects." Physical Review, vol. 140, No. 4A, pp. A1133-A1138 (1965).
Kowalski, Karol et al., "New coupled-cluster methods with singles, doubles, and noniterative triples for high accuracy calculations of excited electronic states." Journal of Chemical Physics, vol. 120, No. 4, pp. 1715-1738 (2004).
Lunt, Richard R. et al., "Transparent, near-infrared organic photovoltaic solar cells for window and energy-scavenging applications." Applied Physics Letters, vol. 98, No. 11, pp. 113305-1-113305-3 (2011).
Lunt, Richard R., "Theoretical limits for visibly transparent photovoltaics." Applied Physics Letters, vol. 101, No. 4, pp. 043902-1-043902-4 (2012).
Martin, Richard L., "Natural transition orbitals." Journal of Chemical Physics, vol. 118, No. 11, pp. 4775-4777 (2003).
Moore, C. A. et al., "Power-scaling effects in dye lasers under high-power laser excitation." Journal of Applied Physics, vol. 49, No. 1, pp. 47-60 (1978).
Ostrowski, Jacek C. et al., "Near-Infrared Electroluminescent Light-Emitting Devices Based on Ethyne-Bridged Porphyrin Fluorophores." Advanced Materials, vol. 15, No. 15, pp. 1296-1300 (2003).
Pansare, Vikram J. et al., "Review of Long-Wavelength Optical and NIR Imaging Materials: Contrast Agents, Fluorophores, and Multifunctional Nano Carriers." Chemistry of Materials, vol. 24, No. 5, pp. 812-827 (2012).
Peng, Xiaojun et al., "Heptamethine Cyanine Dyes with a Large Stokes Shift and Strong Fluorescence: A Paradigm for Excited-State Intramolecular Charge Transfer." Journal of the American Chemical Society, vol. 127, No. 12, pp. 4170-4171 (2005).
Philip, R. et al., "Absorption and fluorescence spectroscopic investigation of indocyanine green." Journal of Photochemistry and Photobiology A: Chemistry, vol. 96, No. 1-3, pp. 137-148 (1996).
Piecuch, Piotr et al., "Efficient computer implementation of the renormalized coupled-cluster methods: The R-CCSD[T], R-CCSD(T), CR-CCSD[T], and CR-CCSD(T) approaches." Computer Physics Communications, vol. 149, No. 2, pp. 71-96 (2002).
Qian, Chao et al., "Synthesis and Downconversion Emission Property of $Yb_2O_3$:$Eu^{3+}$Nanosheets and Nanotubes." Advances in Condensed Matter Physics, vol. 2013, No. 519869, pp. 1-5 (2013).
Reigue, Antoine et al., "CW measurements of resonance Raman profiles, line-widths, and cross-sections of fluorescent dyes: application to Nile Blue A in water and ethanol." Journal of Raman Spectroscopy, vol. 44, No. 4, pp. 573-581 (2013).
Rowan, Brenda C. et al., "Advanced Material Concepts for Luminescent Solar Concentrators." IEEE Journal of Selected Topics in Quantum Electronics, vol. 14, No. 5, pp. 1312-1322 (2008).
Rurack, Knut et al., "Fluorescence Quantum Yields of a Series of Red and Near-Infrared Dyes Emitting at 600-1000 nm." Analytical Chemistry, vol. 83, No. 4, pp. 1232-1242 (2011).
Schmidt, Michael W. et al., "General atomic and molecular electronic structure system." Journal of Computational Chemistry, vol. 14, No. 11, pp. 1347-1363 (1993).
Shao, Yihan et al., "Advances in methods and algorithms in a modern quantum chemistry program package." Physical Chemistry Chemical Physics, vol. 8, No. 27, pp. 3172-3191 (2006).
Shcherbatyuk, G. V. et al., "Viability of using near infrared PbS quantum dots as active materials in luminescent solar concentrators." Applied Physics Letters, vol. 96, No. 19, pp. 191901-1-191901-3 (2010).
Sheng, Xing et al., "Doubling the Power Output of Bifacial Thin-Film GaAs Solar Cells by Embedding Them in Luminescent Waveguides." Advanced Energy Materials, vol. 3, No. 8, pp. 991-996 (2013).
Sholin, V. et al., "Semiconducting polymers and quantum dots in luminescent solar concentrators for solar energy harvesting." Journal of Applied Physics, vol. 101, No. 12, pp. 123114-1-123114-9 (2007).
Shrotriya, Vishal et al., "Accurate Measurement and Characterization of Organic Solar Cells." Advanced Functional Materials, vol. 16, No. 15, pp. 2016-2023 (2006).
Smestad, G. et al., "The thermodynamic limits of light concentrators." Solar Energy Materials, vol. 21, No. 2-3, pp. 99-111 (1990).
Soni, Abhishek Kumar et al., "Host-Sensitized Continuum-Broad-Band White-Light Emitting $Yb_2O_3$:$Er^{3+}$Phosphor under CW-NIR Light Absorption." ChemistrySelect, vol. 4, No. 12, pp. 3408-3415 (2019).
Stanton, John F. et al., "The equation of motion coupled-cluster method. A systematic biorthogonal approach to molecular excitation energies, transition probabilities, and excited state properties." Journal of Chemical Physics, vol. 98, No. 9, pp. 7029-7039 (1993).
Van Sark, Wilfried G.J.H.M. et al., "Luminescent Solar Concentrators—A review of recent results." vol. 16, No. 26, pp. 21773-21792 (2008).
Wang, Tongxin et al., "Luminescent solar concentrator employing rare earth complex with zero self-absorption loss." Solar Energy, vol. 85, No. 11, pp. 2571-2579 (2011).
Weber, W. H. et al., "Luminescent greenhouse collector for solar radiation." Applied Optics, vol. 15, No. 10, pp. 2299-2300 (1976).
Weissleder, Ralph, "A clearer vision for in vivo imaging." Nature Biotechnology, vol. 19, No. 4, pp. 316-317 (2001).
Werts, Martinus H.V. et al., "Fluorescein and eosin as sensitizing chromophores in near-infrared luminescent ytterbium(III), neodymium(III) and erbium(III) chelates." Chemical Physics Letters, vol. 276, No. 3-4, pp. 196-201 (1997).
Wittwer, V. et al., "Fluorescent planar concentrators." Solar Energy Materials, vol. 11, No. 3, pp. 187-197 (1984).
Wloch, Marta et al., "Extension of renormalized coupled-cluster methods including triple excitations to excited electronic states of open-shell molecules." Journal of Chemical Physics, vol. 122, No. 21, pp. 214107-1-214107-15 (2005).
Yanai, Takeshi et al., "A new hybrid exchange-correlation functional using the Coulomb-attenuating method (CAM-B3LYP)." Chemical Physics Letters, vol. 393, No. 1-3, pp. 51-57 (2004).
Yoon, Jongseung et al., "Flexible concentrator photovoltaics based on microscale silicon solar cells embedded in luminescent waveguides." Nature Communications, vol. 2, No. 343, pp. 1-8 (2011).
Zhao, Yimu et al., "Transparent Luminescent Solar Concentrators for Large-Area Solar Windows Enabled by Massive Stokes-Shift Nanocluster Phosphors." Advanced Energy Materials, vol. 3, No. 9, pp. 1143-1148 (2013).
Office Action regarding European Patent Application No. 15764966. 6, dated May 14, 2020.
Office Action regarding Japanese Patent Application No. 2020-003658, dated Jan. 12, 2021. Translation provided by Harakenzo World Patent and Trademark.
Office Action regarding European Patent Application No. 15764966. 6, dated Jan. 22, 2021.
Office Action regarding Japanese Patent Application No. 2020-003658, dated Jun. 29, 2021, English translation provided by Harakenzo World Patent and Trademark. (14 pages).
Wurth, Christian, et al. "Integrating sphere setup for the traceable measurement of absolute photoluminescence quantum yields in the near infrared." Analytical chemistry 84.3 (2012): 1345-1352.
Office Action regarding Japanese Patent Application No. 2020-003658, dated Nov. 2, 2021. Translation provided by Harakenzo World Patent and Trademark.

* cited by examiner

|  | Vertical | 45 | Horizontal |
|---|---|---|---|
| N(0) | 1.2 | 2.1 | 3.9 |
| S(180) | 3.3 | 4.6 | 3.9 |
| E(90) | 2.4 | 3.5 | 3.9 |
| SE(135) | 3.1 | 4.3 | 3.9 |

CY:

HITC:

TRANSPARENT ENERGY-HARVESTING DEVICES

CROSS-REFERENCE TO RELATED APPLICATIONS

This application is a continuation of U.S. patent application Ser. No. 14/220,850, filed on Mar. 20, 2014, which claims the benefit of U.S. Provisional Application No. 61/947,187, filed on Mar. 3, 2014, and U.S. Provisional Application No. 61/804,053, filed on Mar. 21, 2013. The entire disclosures of each of the above applications are incorporated herein by reference.

BACKGROUND

The present application generally pertains to solar concentrators and more particularly to transparent solar concentrators for integrated solar windows.

Integrating solar-harvesting systems into the built environment is a transformative route to capture large areas of solar energy, lower effective solar cell installation costs, and improve building efficiency. Widespread adoption of solar-harvesting systems in a building envelope, however, is severely hampered by difficulties associated with mounting traditional solar modules on and around buildings due to cost, architectural impedance, and most importantly, aesthetics.

The concept of luminescent solar concentrators ("LSCs") is well known, and with recent advances in phosphorescent and fluorescent luminophore efficiencies, LSC system efficiencies have increased to 7.1%. Although optical funneling of light limits the overall system conversion efficiency to less than ten percent (without LSC stacking), it can dramatically reduce the area of expensive solar cells needed, driving down the overall installed cost and increasing the ratio of electricity generation to solar cell surface area. Because of the high cost of glass and real-estate that factor into the module and the balance of systems costs, respectively, such LSCs have rarely been adopted in solar-farm practice despite the increasing performance and potential for low module costs. Furthermore, there has been demonstrated interest in utilizing LSCs as architectural windows. To date, however, these systems have been limited to absorption and emission (glow) in the visible part of spectrum, hindering widespread adoption of such devices in windows. In general, the purpose of windows is to provide natural lighting with a view; that is, most people prefer not to work behind strongly colored glass. A high level of untinted-transparency is therefore desirable for ubiquitous adoption.

The performance of LSCs can be understood by the component efficiencies: luminophore photoluminescence efficiency (quantum yield), solar spectrum absorption efficiency, waveguide (trapping) efficiency, solar cell efficiency, and transport (re-absorption) efficiency. The highest performance LSCs utilize phosphorescent organic molecules or blends of multiple fluorophores (such as quantum dots or organic dyes) that act to reduce reabsorption (Stokes shift) losses and enhance overall absorption efficiencies across the spectrum. The highest efficiencies reported (6-7%) have been for relatively small plates (<0.1m$^2$), since larger LSCs sizes suffer substantial reabsorption losses that limit efficiencies to <5%.

It has long been recognized that LSCs are most limited by reabsorption losses, particularly for larger plate sizes. Indeed, much of the research with LSCs has focused on the reduction of these reabsorption losses through increasing Stokes shifts with organic phosphors, multiple dye optimization to artificially increase the Stokes shift or resonance shifting, applicable only to neat-film dye layers less than several microns thick.

Previous efforts to construct transparent solar-harvesting architectures have focused on: (1) semi-transparent thin-film photovoltaics that typically have severe tinting or limited transmission or have an inherent tradeoff between efficiency and transparency, (2) LSCs incorporating colored chromophores that absorb or emit in the visible, or (3) optical systems using wavelength dependent optics that collect direct light only and require solar tracking. All of these approaches are severely limited in their potential for window applications due to aesthetic properties, bulkiness, or considerably limited transparency. These approaches suffer from an inherent tradeoff between power conversion efficiency ("PCE") and visible transparency ("VT"), since both parameters cannot be simultaneously optimized in conventional devices. Architectural adoption is impeded further with typical organic photovoltaics (PVs) that have peaked absorption within the visible spectrum, resulting in poor color rendering index ("CRI"), high colored tinting, and poor natural lighting quality. In contrast, it would be desirable to obtain visibly transparent, UV/NIR-selective solar concentrators to avoid aesthetic tradeoffs (low VT or CRI) that hinder architectural adoption and provide a clear route to large area scaling.

FIG. 1 shows an illustration of a cross section of a luminescent solar concentrator (LSC) 100 in a traditional configuration. The SC 100 comprises a first inorganic solar cell 105 and a second inorganic solar cell or a reflective film 110, a substrate 115, and a waveguide redirecting material 120. The waveguide redirecting material 120 can be an NIR luminescent dye or scattering particles. Long bracket 125 represents incoming solar flux, short bracket 130 represents NIR light, and block arrow 135 represents visible light. Arrows 140 represent waveguided NIR light. The factors that negatively affect the efficiency of the LSC 100 include poor luminophore photoluminescence efficiency (quantum yield), poor solar spectrum absorption efficiency, poor waveguide (trapping) efficiency, poor solar cell efficiency, and poor transport (re-absorption) efficiency.

Various conventional devices employ a luminescent solar collector having luminescent or scattering agents dispersed throughout. Exemplary U.S. Pat. No. include: 4,155,371 entitled "Luminescent Solar Collector" which issued to Wohlmut et al. on May 22, 1979; U.S. Pat. No. 4,159,212 entitled "Luminescent Solar Collector" which issued to Yerkes on Jun. 26, 1979; U.S. Pat. No. 4,357,486 entitled "Luminescent Solar Collector" which issued to Blieden et al. on Nov. 2, 1982; 2009/0027872 entitled "Luminescent Object Comprising Aligned Polymers having a Specific Pretilt Angle" which published to Debije et al. on Jan. 29, 2009; and 2010/0288352 entitled "Integrated Solar Cell Nanoarray Layers and Light Concentrating Device" which published to Ji et al. on Nov. 18, 2010. All of these references are incorporated by reference herein.

SUMMARY

In accordance with the present technology, a transparent luminescent solar concentrator (TLSC) is provided. Systems include those comprising a solar photovoltaic array, a waveguide, and a waveguide redirecting material. In various embodiments, the waveguide redirecting material is coupled to the solar photovoltaic array. The waveguide redirecting material may be embedded in the solar photovoltaic array. In some embodiments, the waveguide redirecting material is juxtaposed to the at least one solar photovoltaic array. The waveguide redirecting material may comprise a scattering nanoparticle. The system may comprise a plurality of arrays.

In one aspect, a luminescent solar concentrator (LSC) selectively absorbs NIR light with wavelengths of greater than about 650 nm. A further aspect of a luminescent solar concentrator employs scattering nanocrystal clusters embedded in a polymeric matrix.

The present apparatus and method are advantageous over traditional devices. For example, the present luminescent solar concentrator is highly transparent to human vision, thereby making it ideally suited for use in viewing windows in a structural building, greenhouses, automotive vehicle, aircraft, watercraft, or the like. Moreover, the luminophore and host composition aspect of the present apparatus achieve a quantum yield greater than about 10-25%.

To overcome prior disadvantages, the present low-cost, solar concentrator is highly transparent in the visible spectrum, and enables integration onto window and glazing systems in the building envelope. The excitonic character and structured absorption of molecular dyes will produce near-infrared ("NIR") LSC architectures that selectively harvest NIR light by waveguiding deeper-NIR luminophore emission to high efficiency segmented solar cell arrays that are embedded within the waveguide, thereby reducing any visual impact and minimizing the amount of expensive solar material required while extending the photon harvesting range into the NIR. Specific luminophores that can harness the majority of near-infrared photons are ideally suited for these transparent systems. Luminophore blends of cyanine, cyanine salts, and squaryliums are particularly suited for TLSCs with high transparency and minimal tinting. Accordingly, this apparatus optimizes transparent solar concentrators with system efficiencies greater than about 0.1-5%, average visible transmittance of greater than about 70%, and a color rendering index of greater than about 85 for widespread window deployment. These SCs generate electricity from both direct and incident light, and enhance the low-light efficiency through solar concentration while maintaining window glass aesthetics and architectural design freedom.

DRAWINGS

The drawings described herein are for illustrative purposes only of selected embodiments and not all possible implementations, and are not intended to limit the scope of the present disclosure.

Figure 9A:
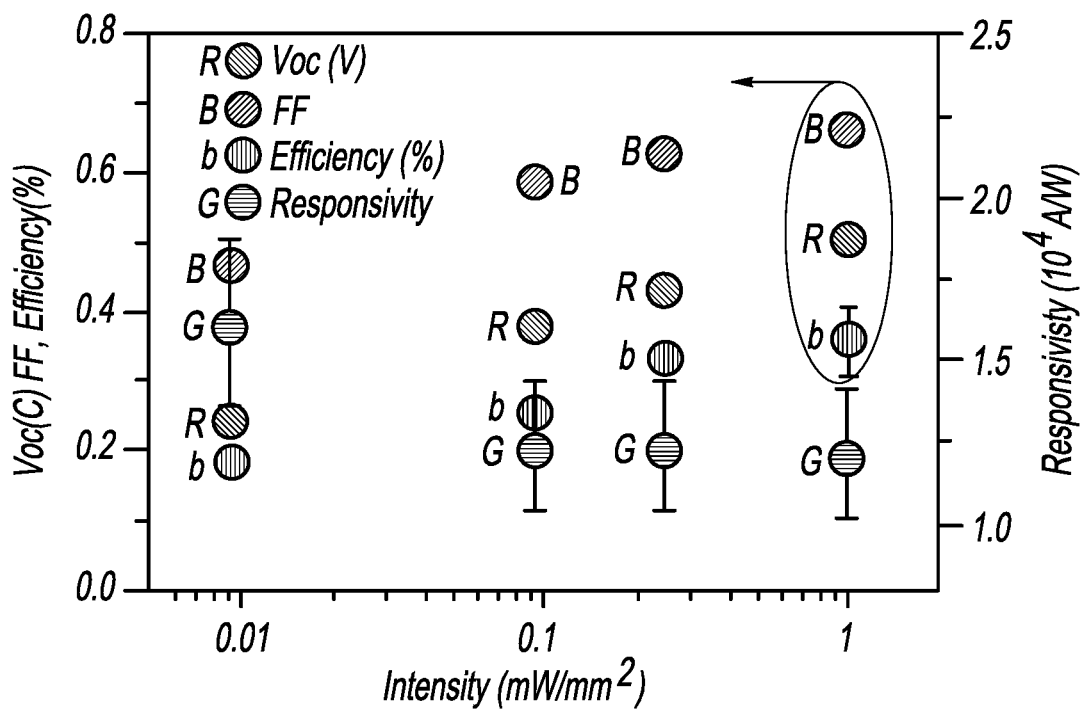
Figure 9B:
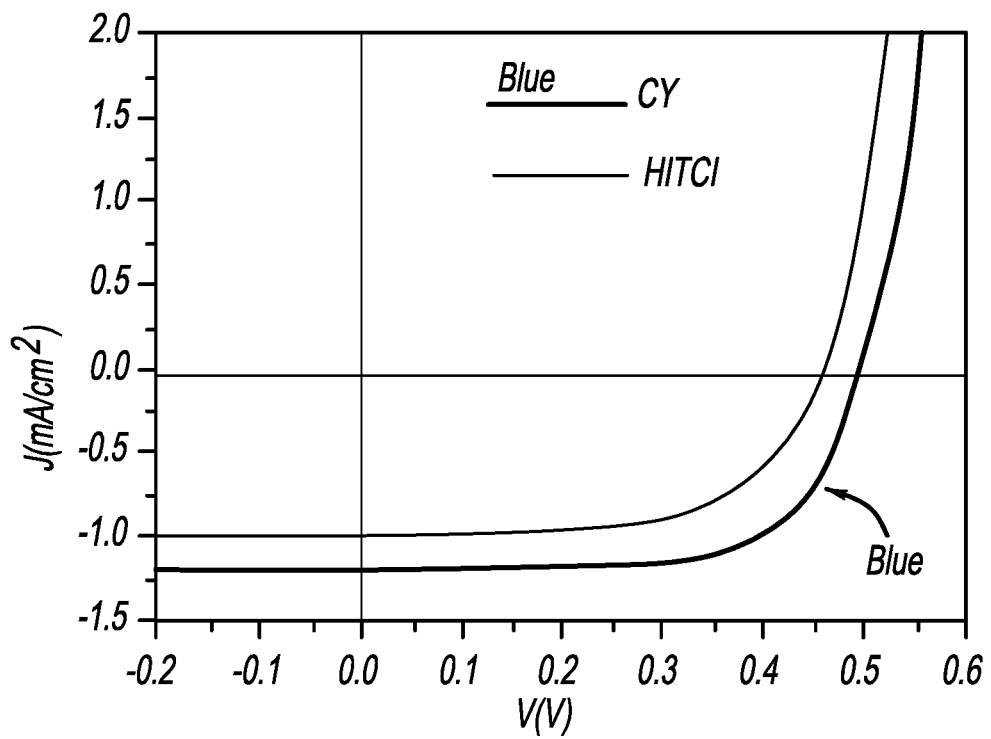
Figure 9C:
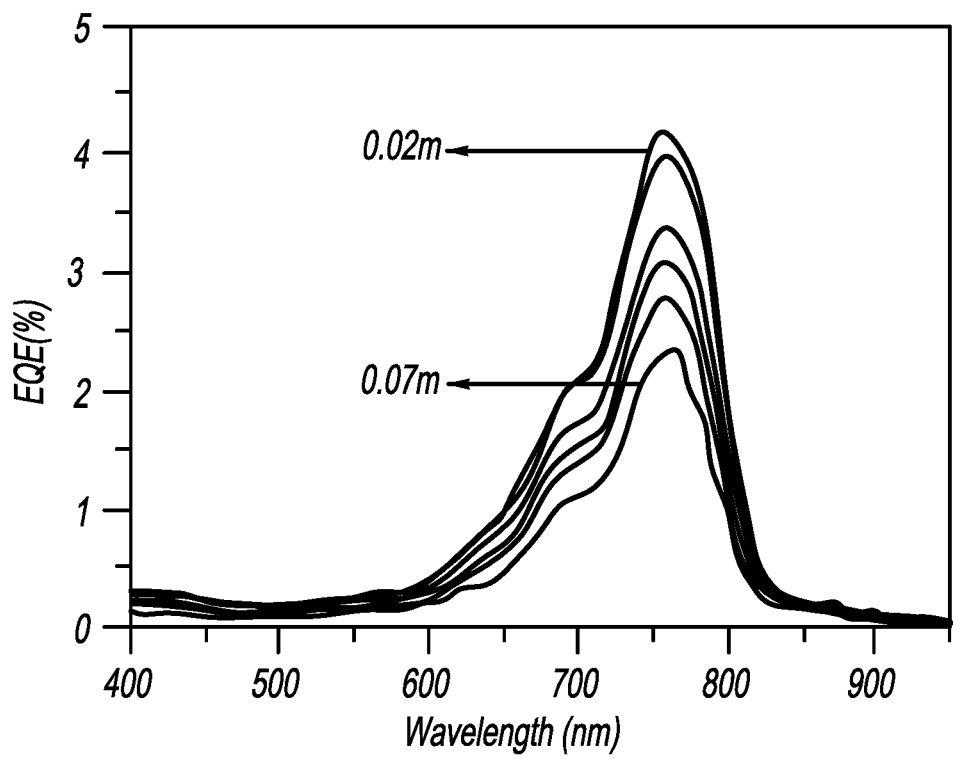
Figure 9D:
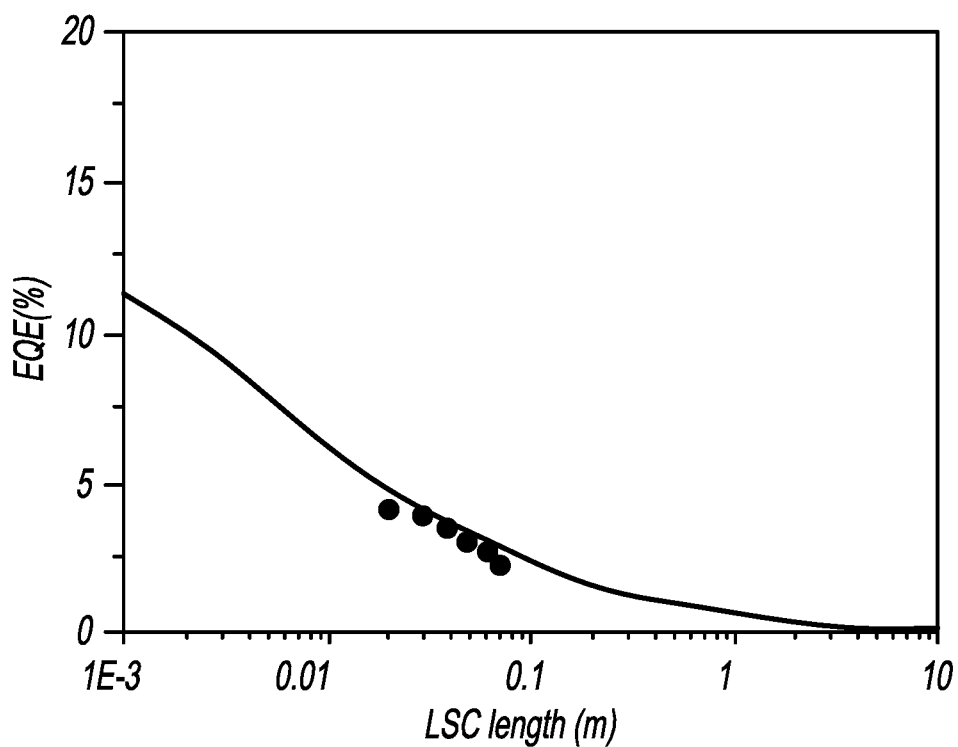
Figure 10:
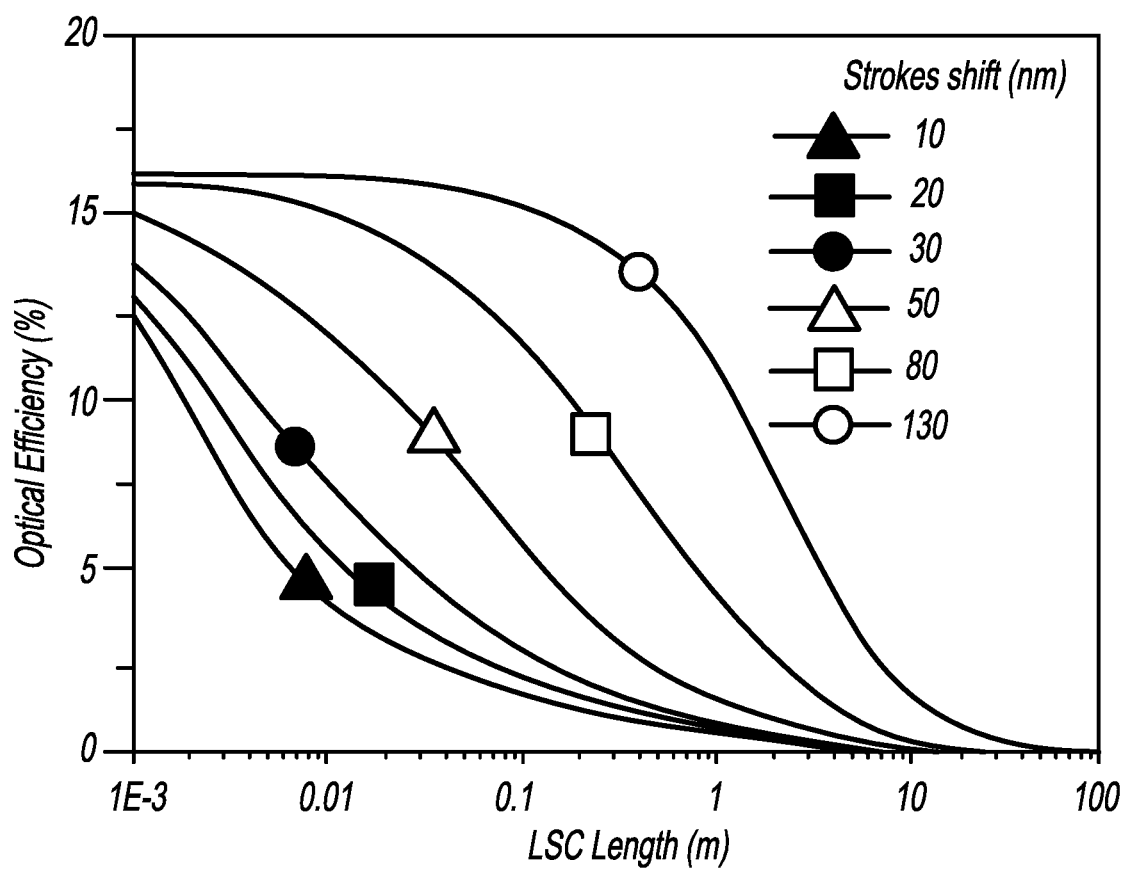

FIGS. 9A-9D show (9A) light intensity dependence of the $V_{oc}$, FF, power efficiency, and responsivity of the CY device, (9B) current density as a function of voltage for the fully assembled LSC systems with two luminophores, (9C) EQE of the LSC system as a function of wavelength measured from 0.02 m to 0.07 m, at 10 mm increments, and (9D) calculated EQE as a function of CY LSC length with the measured EQE shown as circles; and FIG. 10 shows a calculation of CY LSC optical efficiency as a function of LSC length with as a function of simulated Stokes shift, wherein CY and HITCI are references with Stokes shifts of 20 nm and 30 nm, respectively.

Corresponding reference numerals indicate corresponding parts throughout the several views of the drawings.

DETAILED DESCRIPTION

The following description of technology is merely exemplary in nature of the subject matter, manufacture and use of one or more inventions, and is not intended to limit the scope, application, or uses of any specific invention claimed in this application or in such other applications as may be filed claiming priority to this application, or patents issuing therefrom.

The description and specific examples, while indicating embodiments of the technology, are intended for purposes of illustration only and are not intended to limit the scope of the technology. Moreover, recitation of multiple embodiments having stated features is not intended to exclude other embodiments having additional features, or other embodiments incorporating different combinations of the stated features. Specific examples are provided for illustrative purposes of how to make and use the compositions and methods of this technology and, unless explicitly stated otherwise, are not intended to be a representation that given embodiments of this technology have, or have not, been made or tested.

Embodiments of the present apparatus and method are directed to an improved light harvesting system that incorporates a segmented solar array at a top and/or bottom surface (rather than an edge of a waveguide). The system, which comprises a luminescent solar concentrator (LSC), can selectively harvest light with a wavelength in a near-infrared (NIR) region of an electromagnetic spectrum. Accordingly, by selectively harvesting NIR light, the luminescent solar concentrator can be transparent, or substantially transparent, to a human eye.

Figure 1:
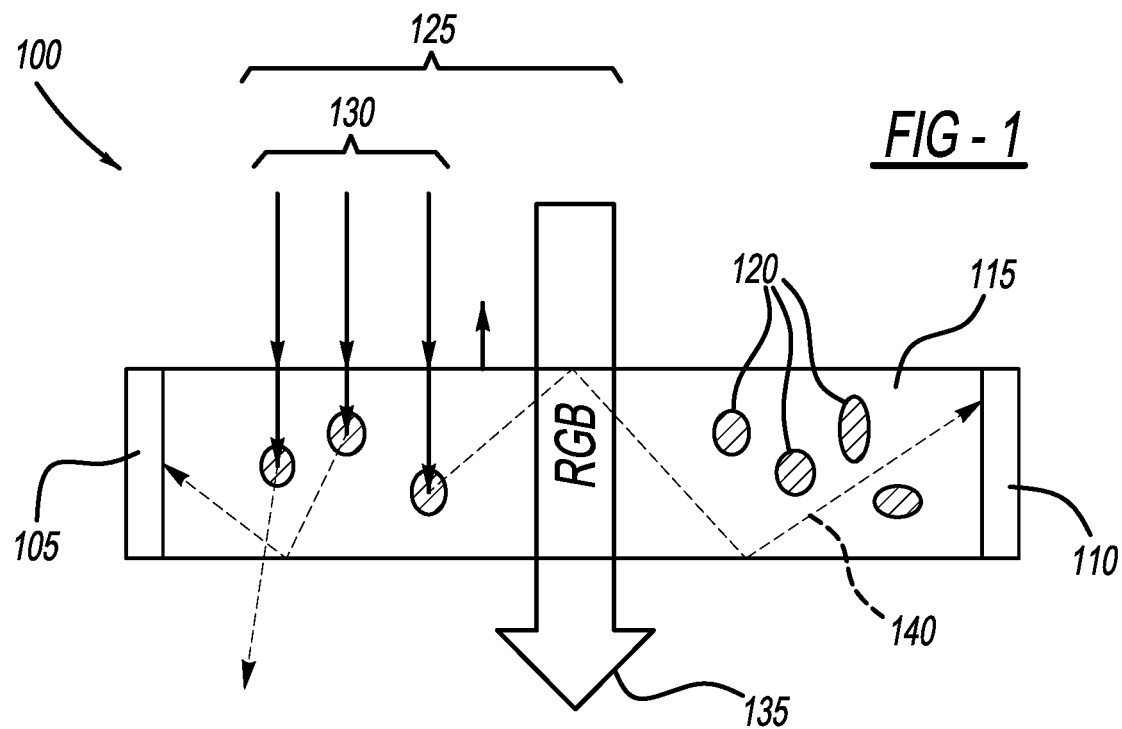
FIG. 1 is an illustration of a traditional luminescent or scattering solar concentrator.
Figure 2:
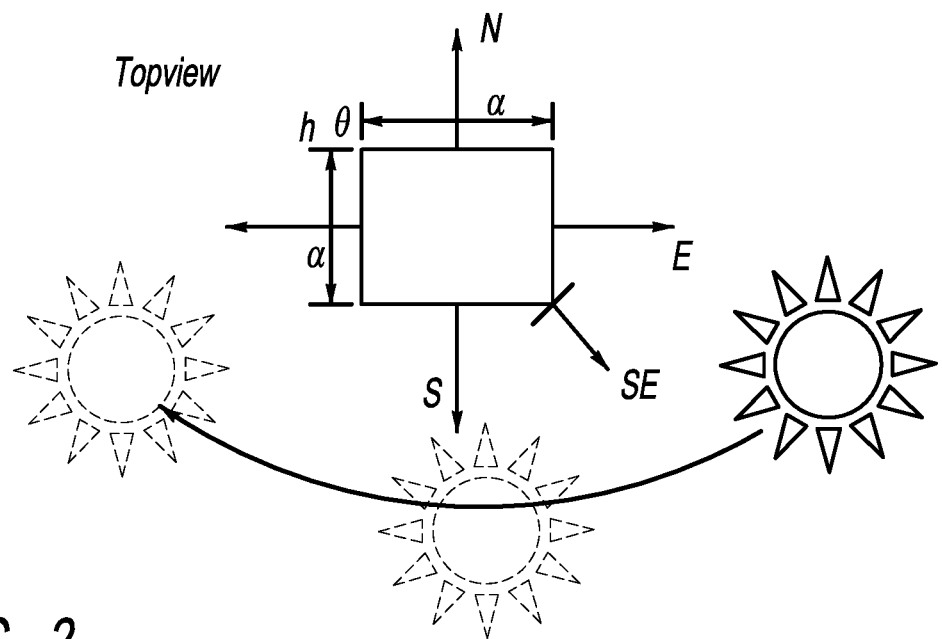
FIG. 2 is an illustration showing solar flux around a building in Boston, Mass.

The present LSC can be used in creating three-dimensional structures, such as solar towers, obelisks, and windows to enhance solar collection. These structures can collect substantially more flux than solar tracking units of an equivalent footprint. Likewise, buildings can act as excellent solar collectors, collecting sunlight effectively throughout the day on each face. For example, in FIG. 2, it is estimated that the total solar flux density from all four sides of a vertical building in Boston (9.3 kW-hr/vertical-m$^2$-day) is substantially more than for a solar tracking unit, even, of equivalent footprint (6.0 kW-hr/horizontal-m$^2$-day), and even greater if the total vertical area utilized in the building is accounted for; while South-facing vertical windows will give the highest solar flux (and therefore power output), East-West facing windows extend the useful power production throughout the day.

Roughly 17% of all building electricity in the U.S. is used for lighting. Incentivizing solar window adoption can encourage architects to utilize more window space, increasing natural lighting, and reducing lighting costs. Reproducing the solar spectrum is the goal of most artificial lighting applications. Each solar window will impart a small modification to the spectrum transmitted. Thus, the color rendering index ("CRI") is used for evaluation by convoluting the transmission spectra with the solar spectrum (e.g., AM1.5G, etc.). The color rendering framework is useful for defining the visible part of the spectrum that should be transmitted and the components that can be utilized for power generation. For example, the 1931 CIE coordinate plots end at approximately 660 nm and 440 nm, with very little photopic response above and below these limits, respectively, defining the active spectral range to utilize as ≤440 nm and ≥660 nm. While there is some response in the ranges from 380-440 nm and 660-720 nm, the response is particularly limited (<2% of the peak response) so that these wavelengths do not contribute significantly to the overall perception of color.

As used herein, the CRI is the range of perceptible visible light. The CRI is subsequently utilized to determine thermodynamic efficiency limits for visibly transparent solar cells. Specifically, the CRI is a quantitative metric for evaluating the quality of lighting systems and can be utilized to evaluate the level or perceptible color-tinting of a window. CRIs are calculated based on ideal transmission profiles (step-functions) in combination with International Commission on Illumination (CIE) 1976 three-dimensional uniform color space (CIELUV), CIE 1974 test-color samples, and with correction for chromatic adaptation (non-planckian-locus), when necessary, according to:

$$CRI = \frac{1}{8}\sum_{i=1}^{8}\left(100 - 4.6\sqrt{(\Delta L_i^*)^2 + (\Delta u_i^*)^2 + (\Delta v_i^*)^2}\right)$$

where $\Delta L_i^*$, $\Delta u_i^*$, and $\Delta v_i^*$ are the difference in lightness (L*) and chromaticity coordinates (u*, v*) between each color sample, i (8 in total) "illuminated" with a fixed reference solar spectrum (AM1.5G) and the transmission sources (T(λ)·AM1.5(λ)). The weighted average visible transmittance (VT) is calculated according to:

$$VT = \frac{\int T(\lambda)P(\lambda)S(\lambda)d\lambda}{\int P(\lambda)S(\lambda)d\lambda}$$

where λ is the wavelength, T is the transmission spectrum, P is the photopic response of the human eye, S is the solar energy flux, and the integration is preformed over a sufficient wavelength range to completely encompass P (e.g., 300-900 nm) so that it is accordingly independent of any defined visible wavelength range. CRI and average VT are described in detail in Lunt, "Theoretical Limits for Visibly Transparent Photovoltaics." Appl. Phys. Lett., 101, 043902 (2012), which is incorporated herein by reference in its entirety.

A significant fraction (~15%) of building electricity is utilized for air-conditioning. Conversion of electricity to heat is highly efficient (nearly 100%), while cooling efficiencies are significantly lower. The present LSCs, used as solar windows, can dramatically reduce unwanted solar heating from infrared flux by utilizing this energy for electricity generation and rejecting the rest from transparent, NIR-selective mirrors. This added benefit of utilizing this unwanted resource for electricity generation could compliment or replace current low solar heat gain coefficient (SHGC) coating technologies. This heat-rejection functionally can enhance the effective LEC from direct power generation by 50-100%.

A great fraction of the solar photon flux is in the NIR (~74%) region of the electromagnetic spectrum. This limitation is overcome by positioning highly-segmented, 50-100 μm wide, solar cell arrays commercially available and: (1) wired in parallel or in series, or (2) laser-patterned as meshes and embedded throughout the LSC waveguide, allowing for the use of smaller Stokes shift NIR fluorophores.

Figure 3A:
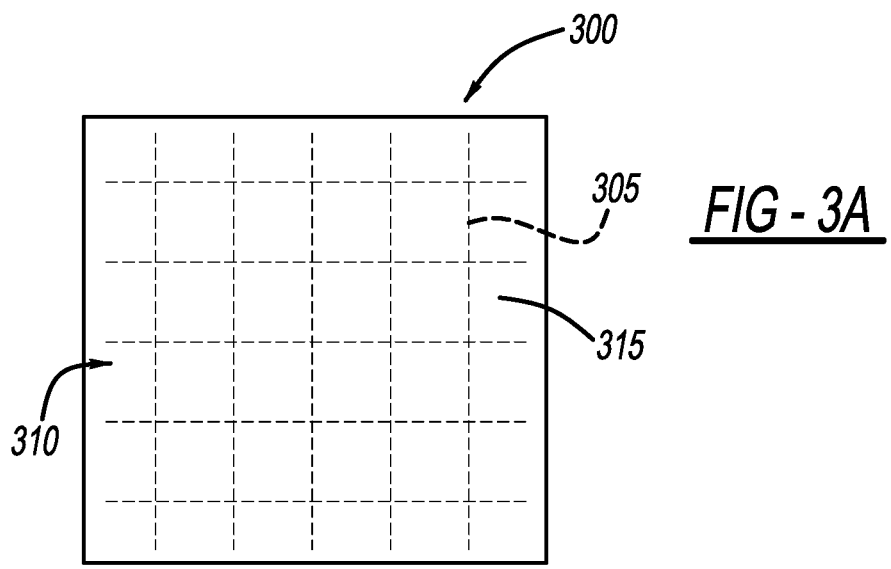
FIGS. 3A-3D show illustrations of a first solar concentrator.
Figure 3B:
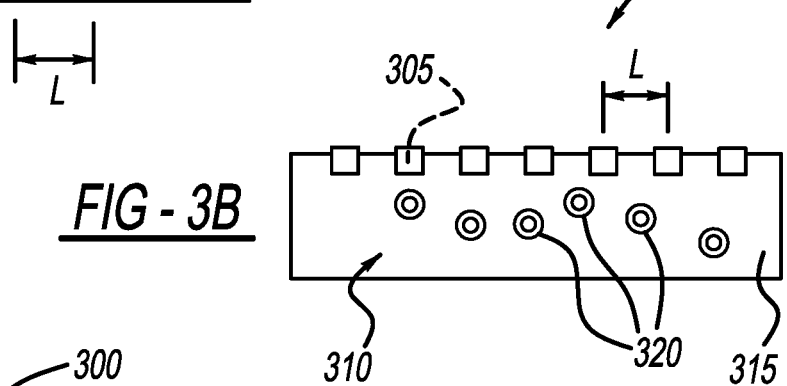

With reference to FIG. 3, a first embodiment of a solar concentrator (SC) 300, shown in a first orientation FIG. 3A and a second orientation FIG. 3B, includes a segmented inorganic solar photovoltaic array 305 positioned at the top, middle, or bottom of a waveguide 310. In various embodiments, the solar array 305 is a mesh comprising wires, microwires, nanowires, ribbons, slivers, spheres, dots, or combinations thereof, or the like arranged within or placed on a surface of the waveguide. More than one photovoltaic array 305 can be utilized to reduce thermal losses. Cost and availability, however, will ultimately drive the cell design. In some embodiments, the SC 300 comprises a solar cell on an edge of the waveguide 310. As a non-limiting example, GaAs cells could boost solar cell efficiency (ηsc) just over 30% compared to Si, but estimated costs for these cells are more than double or triple that of Si. For the least expensive 15-20% Si modules available, the monochromatic efficiency translates ηPV=22-24% for NIR LSC (emission 900 nm) material sets. Accordingly, it is envisioned that LSC systems can be efficiently coupled with Si as less expensive higher bandgap cells (e.g., GaAs, and GaInP) become available. The solar array 305 or solar cell can comprise any material known in the art. Non-limiting examples of solar array and solar cell materials include germanium (Ge); amorphous germanium (a-Ge); gallium (Ga); gallium arsenide (GaAs); silicon (Si); amorphous silicon (a-Si); silicon-germanium (SiGe); amorphous silicon-germanium (a-SiGe); gallium indium phosphide (GaInP); copper indium selenide, copper indium sulfide, or combinations thereof (CIS); copper indium gallium selenide, copper indium gallium sulfide, or combinations thereof (CIGS); cadmium telluride (CdTe); perovskites (PV), such as $CH_3NH_3PbI_3$, $CH_3NH_3PbCl_3$ and $CH_3NH_3PbBr_3$; and combinations thereof.

Referring again to FIG. 3, the waveguide 310 comprises a transparent or substantially transparent substrate 315, such as, glass, plastic, poly(methyl methacrylate) (PMMA), poly-(ethylmethacrylate) (PEMA), or (poly)-butyl methacrylate-co-methyl methacrylate (PBMMA) having a waveguide redirecting material 320 formed therewith, such as through coating or spraying on the substrate 315 or layering dyed sheets as strata between alternating stacks of the substrate 315. In some embodiments, the waveguide redirecting material 320 is embedded with the substrate 315. The waveguide redirecting material 320 can be a visibly-transparent NIR luminescent dye or scattering particles. The luminescent dye or scattering particles can be nanocrystal clusters embedded in a matrix. Because glass absorption contributes to loss, highly transparent low iron glasses, such as Diamont® low iron glass, Planilux® transparent glass from Saint Gobain (Paris, France), and Borofloat® 33 borosilicate glass from Schott (Mainz, Germany), are preferred. These glasses are substrates of choice for commercial deployment over other polymer bases waveguides, which are rarely utilized as the base component in windows and exhibit particularly low absorption coefficients comparable to that of PMMA. Advantageously, the proximity of the solar cell to the dyes allows a smaller Stokes shift dye to be used, while still reducing thermal losses and improving overall system efficiency.

Figure 3C:
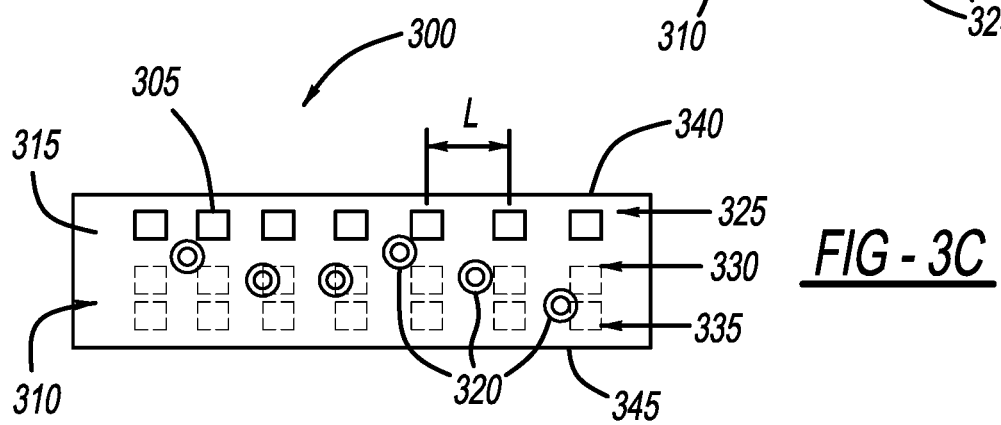
Figure 3D:
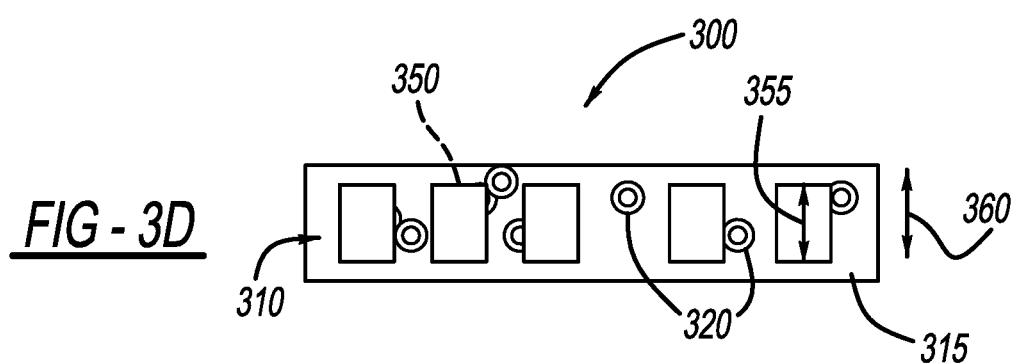

As shown in FIG. 3C, in various embodiments, the solar array 305 can be embedded within the substrate 315. The solar cell 305 can be embedded in a first position 325, near a first surface 340 of the SC 300. Alternatively, the solar array 305 can be embedded in a second position 330, in a middle area of the SC 300. Also, the solar array 305 can be embedded in a third position 335, near a second surface 345 of the SC 300. The middle area 300 is between the first surface 340 and the second surface 345. Additionally, the SC 300 can comprise a plurality of solar photovoltaic arrays 305, positioned at different locations within the substrate 315. The solar array 305 can also be at or near one or both of the first surface 340 or the second surface 345. In one embodiment, the SC 300 comprises a solar cell at a side of the waveguide 310 that is adjacent to the first surface 240 and the second surface 345. In yet another embodiment, shown in FIG. 3D, a solar cell array 350 has a thickness 355 that is about the same overall thickness 360 of the SC 300.

Figure 4A:
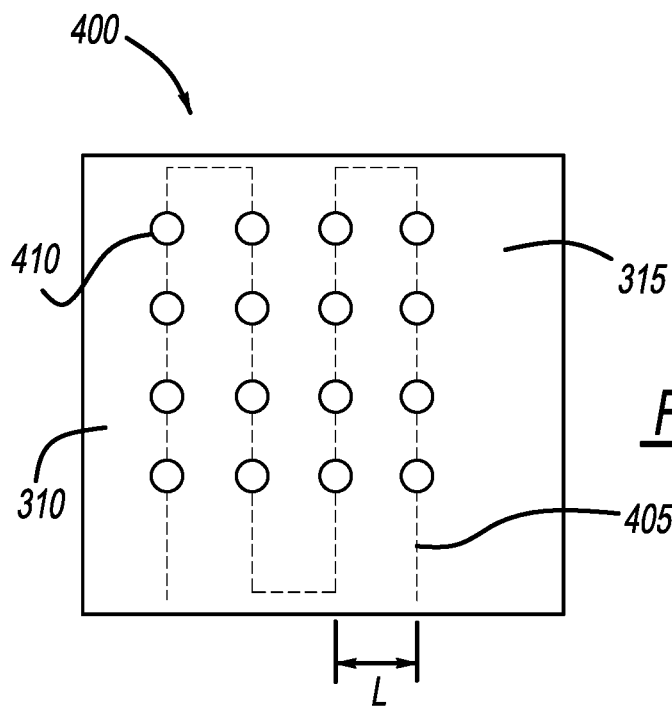
FIGS. 4A-4D show illustrations of a second solar concentrator.
Figure 4B:
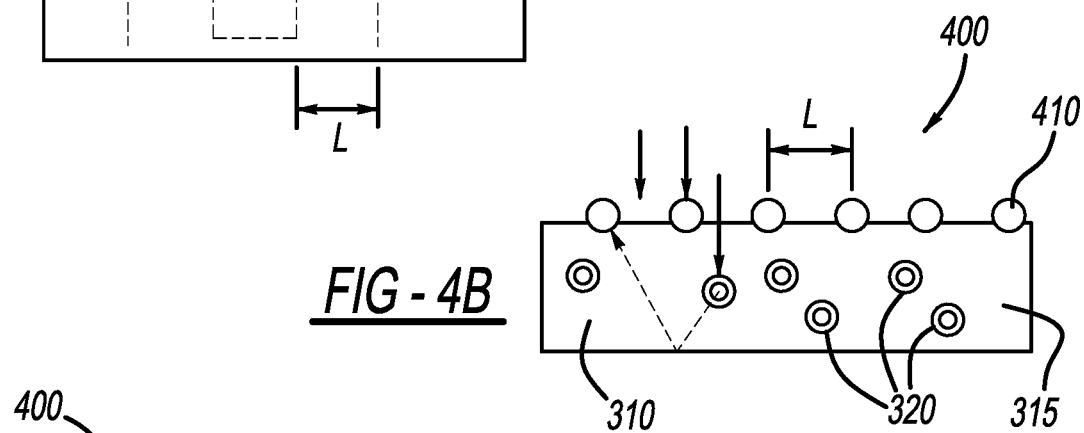
Figure 4C:
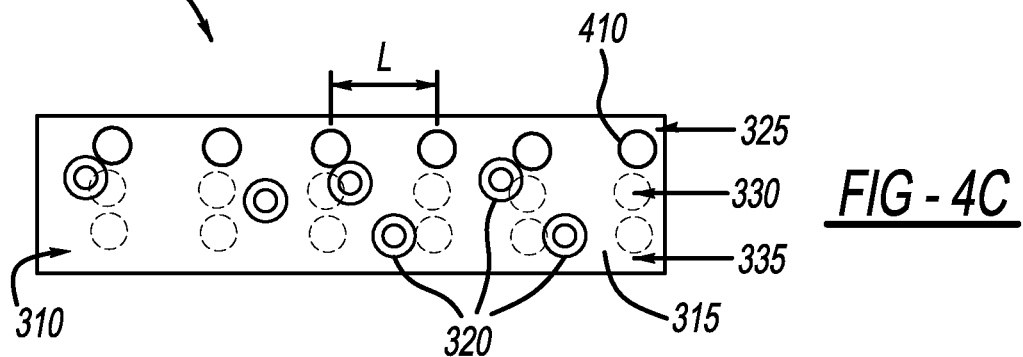
Figure 4D:
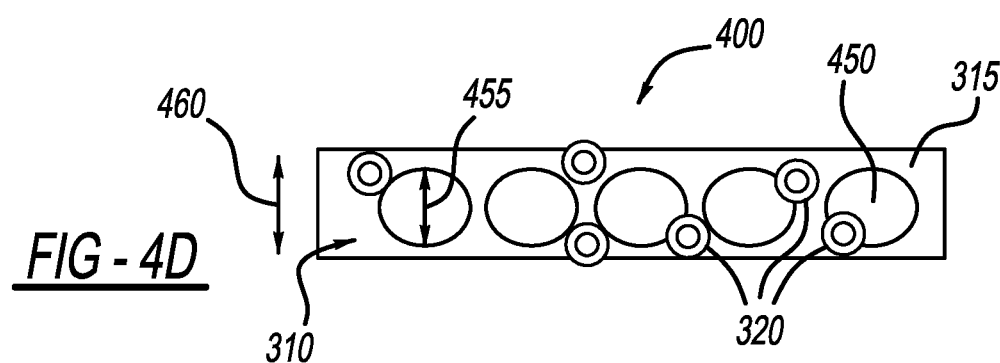

As exemplified in FIG. 4, a second embodiment of a solar concentrator 400, substantially similar to that described with respect to the first embodiment (FIG. 3), is shown in a first orientation in FIG. 4A and a second orientation in FIG. 4B. However, a solar photovoltaic array 405 is wired in series may include adducts 410, such as spheres or dots. For example, the solar array 405 may comprise a Si sphere solar array connected by thin-wire electrical connections. In a preferred embodiment, the solar array 405 comprises spheres that are wired together to form a mesh. Advantageously, using spherical or multi-sided solar arrays 405 further increases system efficiency as each cell can capture both direct and indirect sunlight at multiple angles. As shown in FIGS. 4C and 4D, the solar array 405 can be located at different positions within the substrate 315, at or near the surfaces of the SC 400, or the solar array 405 can have a thickness 455 that is about the same overall thickness 460 of the SC 400. In some embodiments, the SC 400 can comprise a plurality of solar photovoltaic arrays cells 405, located at different positions within the substrate 315. In other embodiments, the SC 400 comprises a solar cell positioned on an edge of the waveguide 310 that is adjacent to the surfaces. The solar array 405 or solar cell can be made of any material known in the art, as discussed above.

By positioning segmented solar cell arrays at the top or bottom of the waveguide, it is possible to capture luminesced light before it is lost optically due to dye reabsorption. Alternatively, the solar arrays can be embedded within the waveguide. This loss of reabsorption is particularly beneficial for fluorescent materials with small Stokes shifts. Depending on where the solar cell arrays are positioned in the waveguide, the waveguide redirecting material can be either embedded in, or juxtaposed to, the solar photovoltaic array. Using dyes with small Stokes shifts as a waveguide redirecting material enables a use of solar cells with larger open circuit voltage, $V_{oc}$. Such dyes reduce thermal losses and improve overall system efficiency. Also, by positioning the arrays at the top or bottom of the waveguide, a fraction of forward emitted light can be captured, which further reduces optical losses, and it enhances the efficiency of spatially segmented solar cells by utilizing a greater fraction of NIR light between cells. The positioning generates an architecture that is simpler than thin-film transparent photovoltaics for transparent power producing windows. Furthermore, the architecture can lead to increased window lifetime as well.

Figure 5:
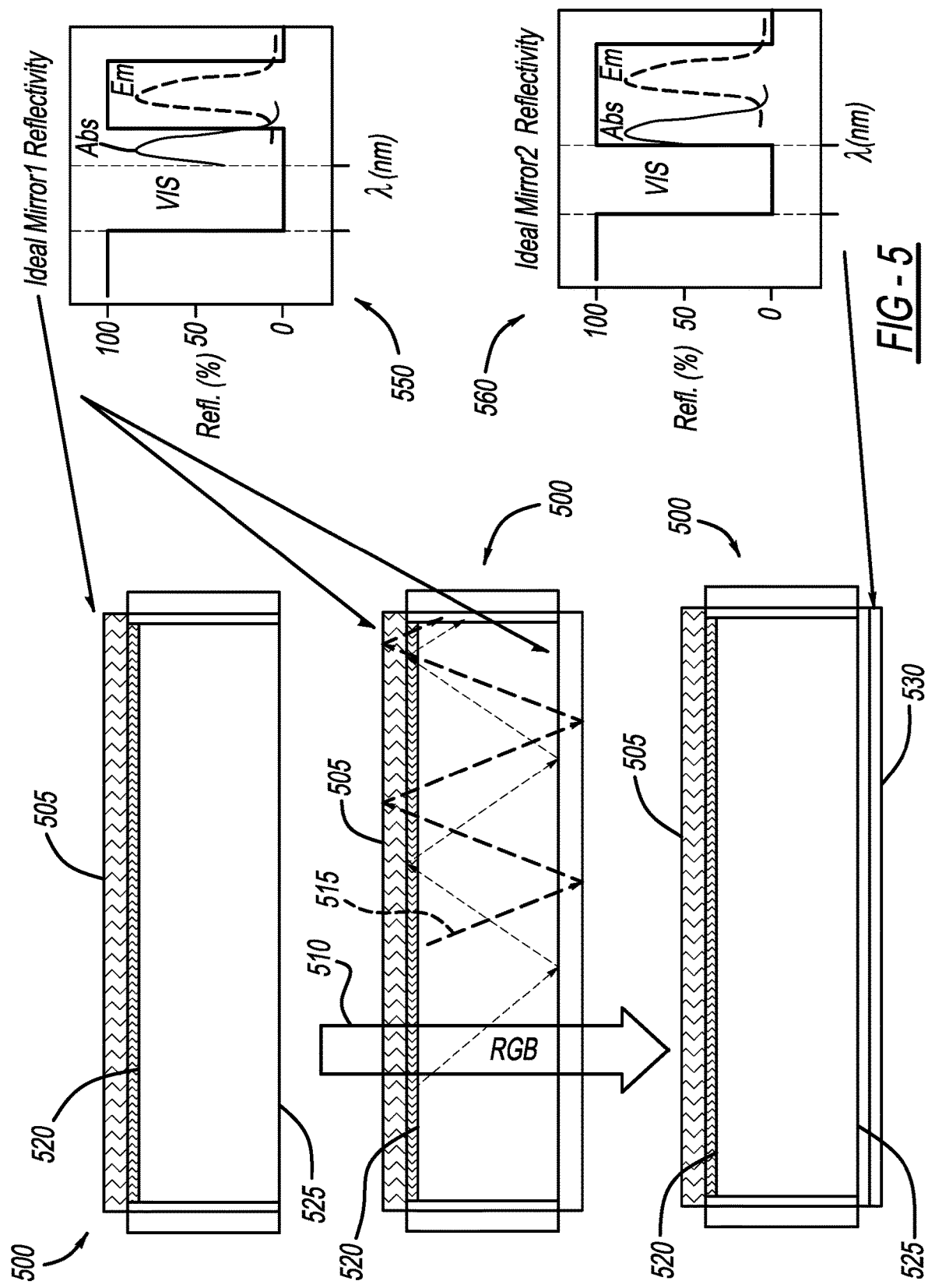
FIG. 5 is an illustration of solar concentrators with reflective mirrors.
Figure 6A:
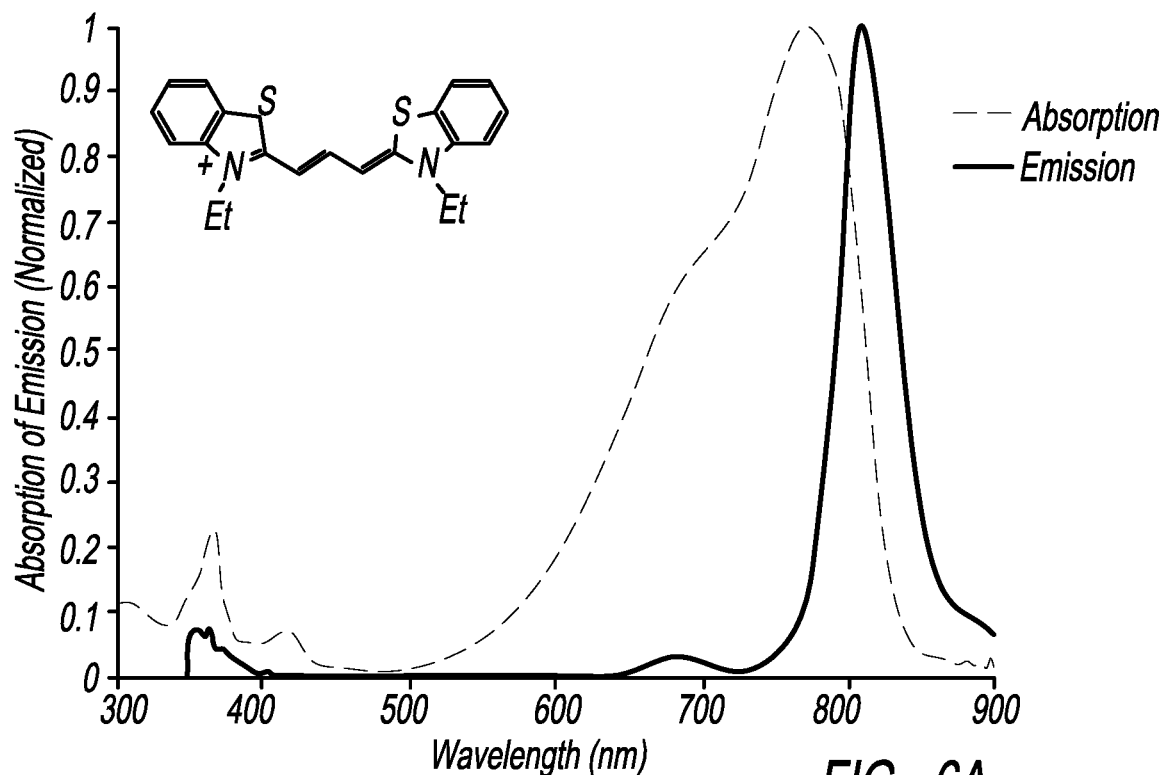
FIGS. 6A-6J are graphs showing absorption and emission spectra of various luminophores.
Figure 6B:
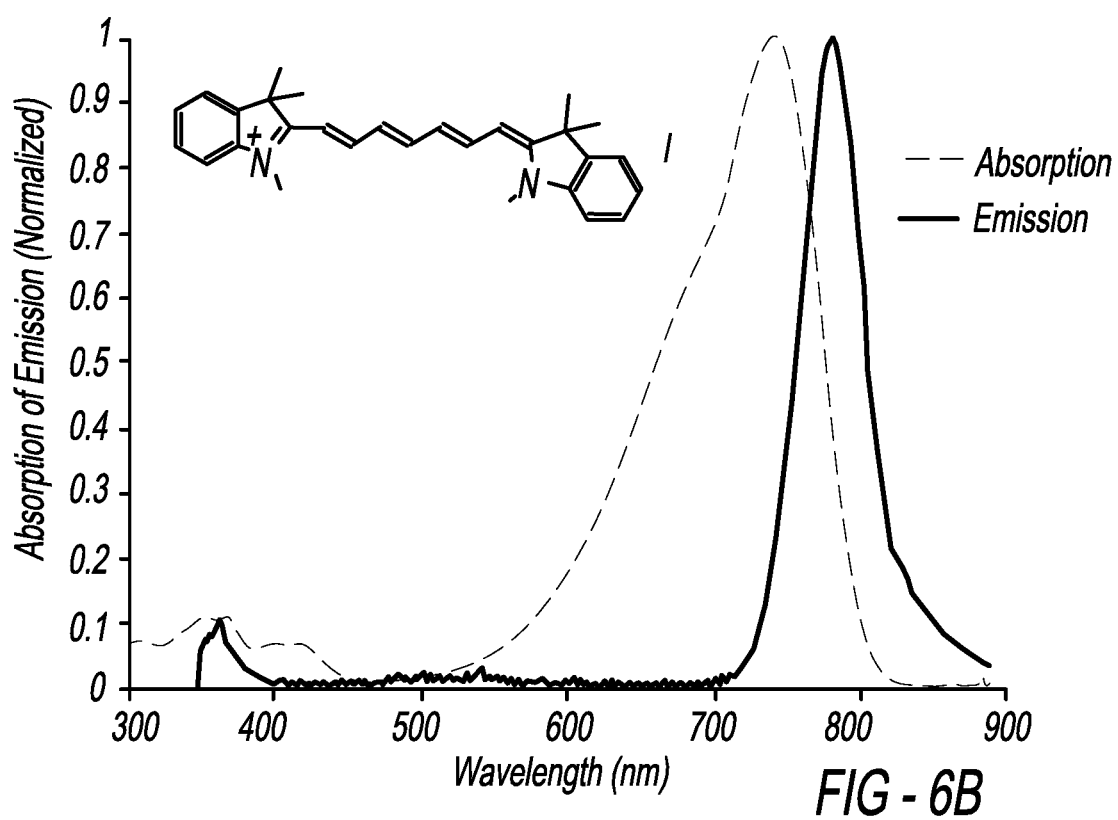
Figure 6C:
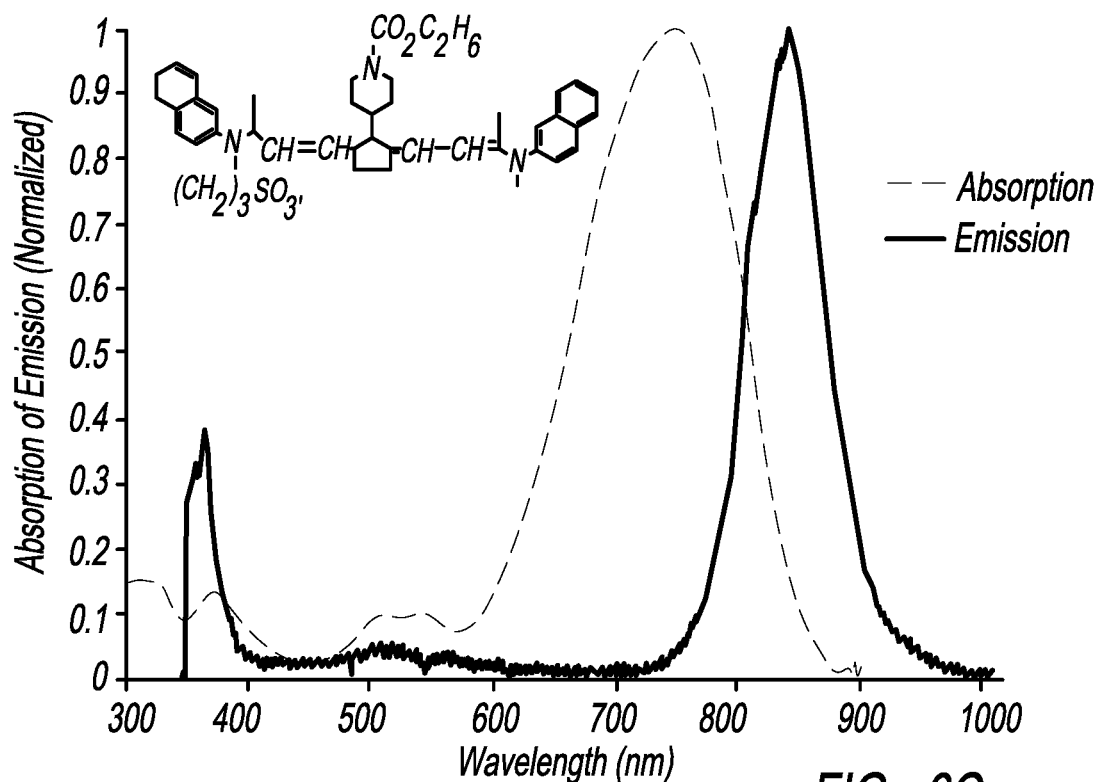
Figure 6D:
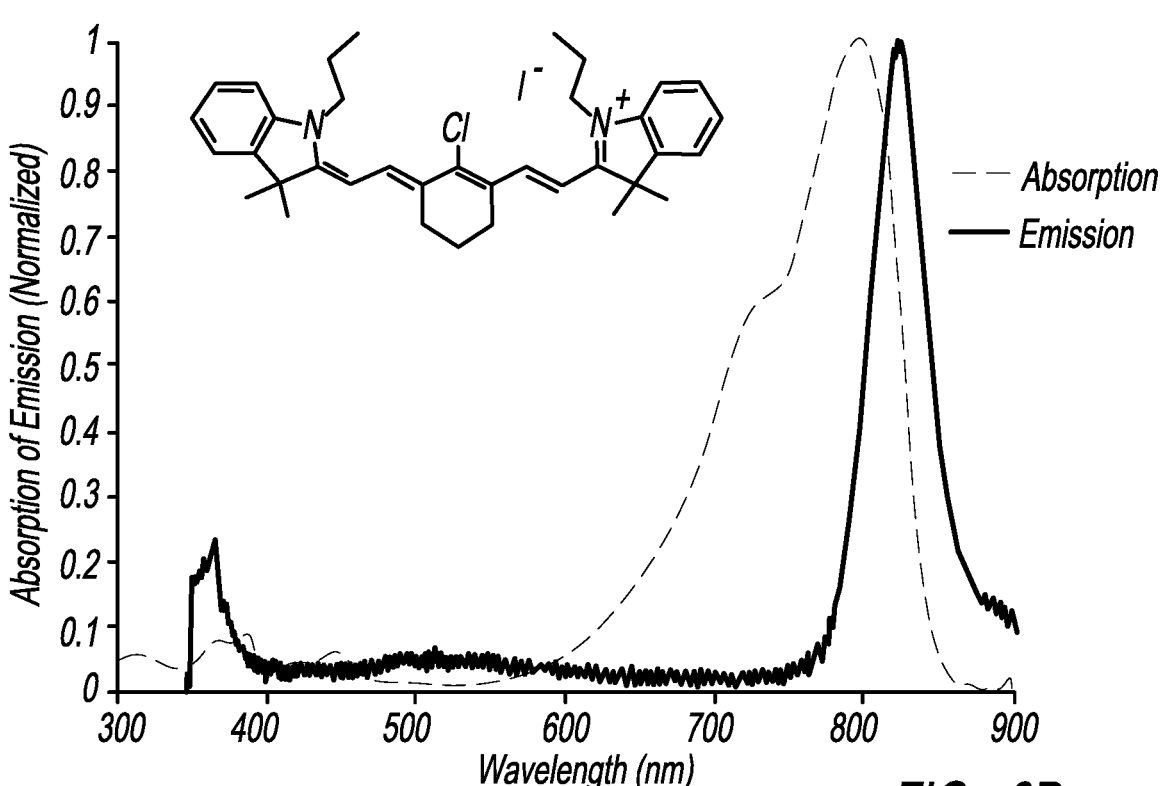
Figure 6E:
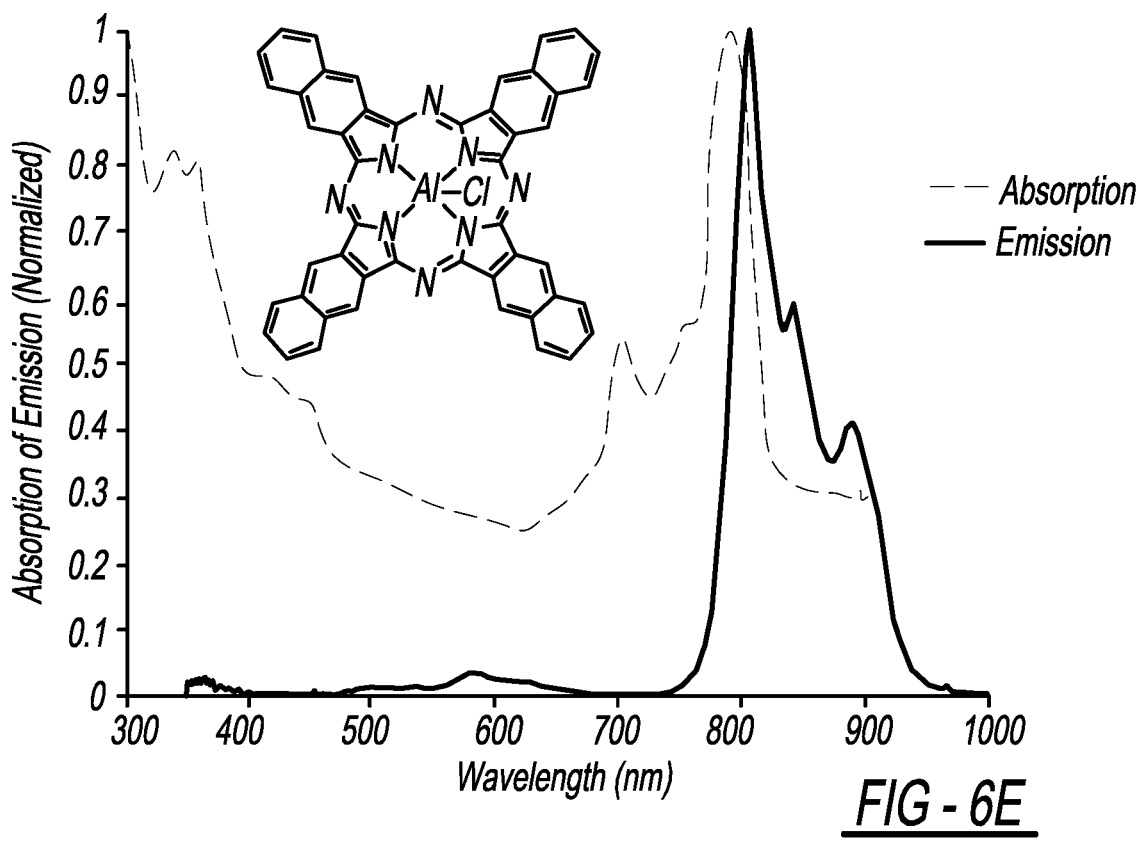
Figure 6F:
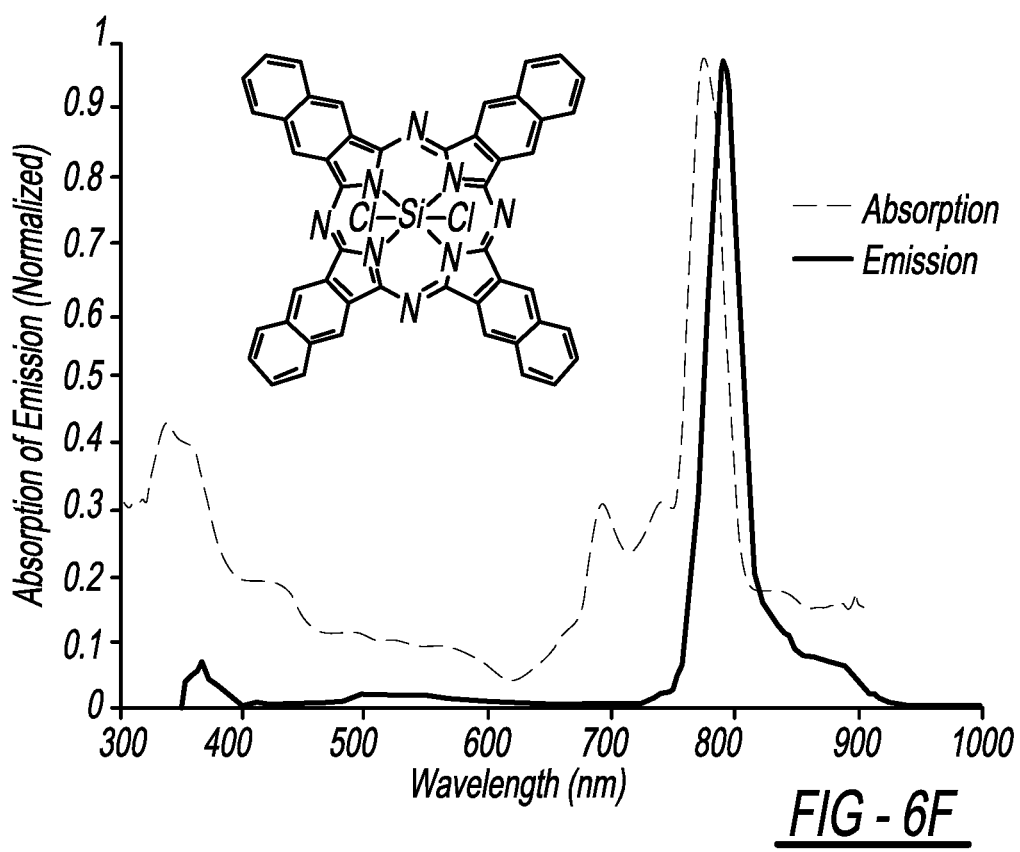
Figure 6G:
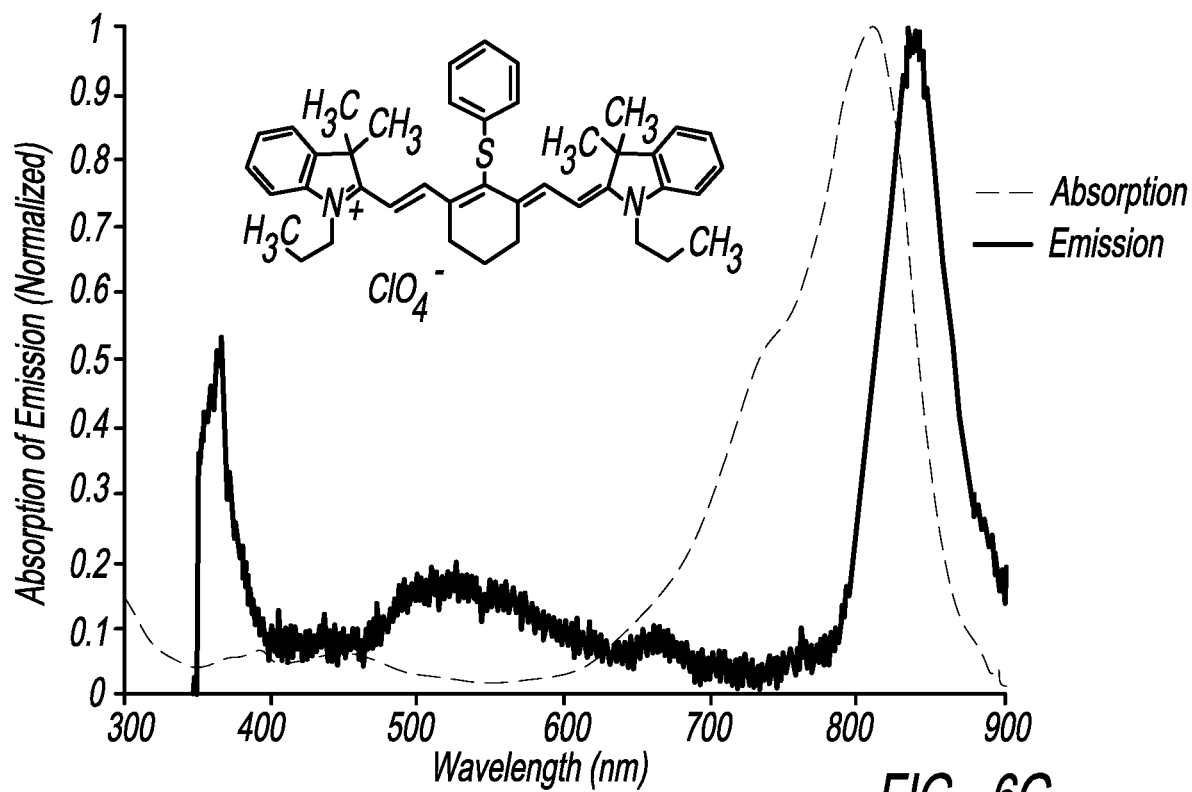
Figure 6H:
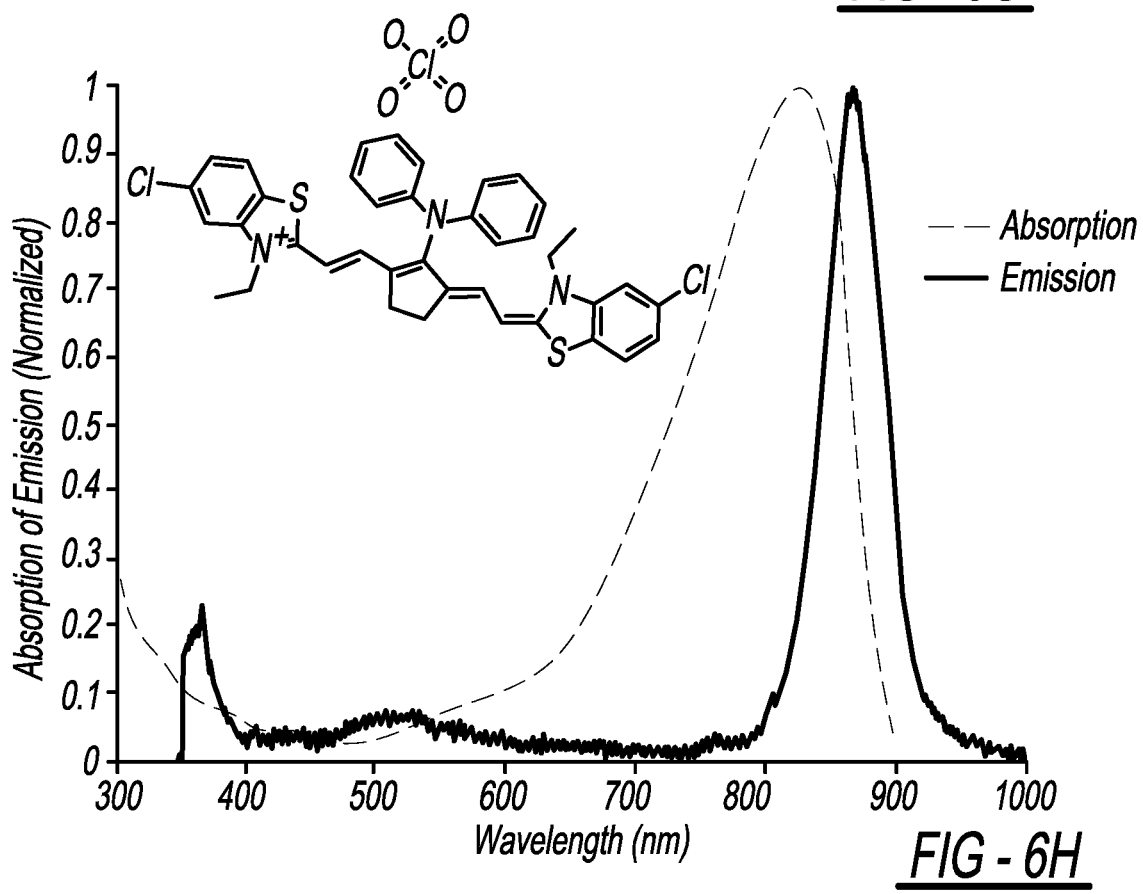
Figure 6I:
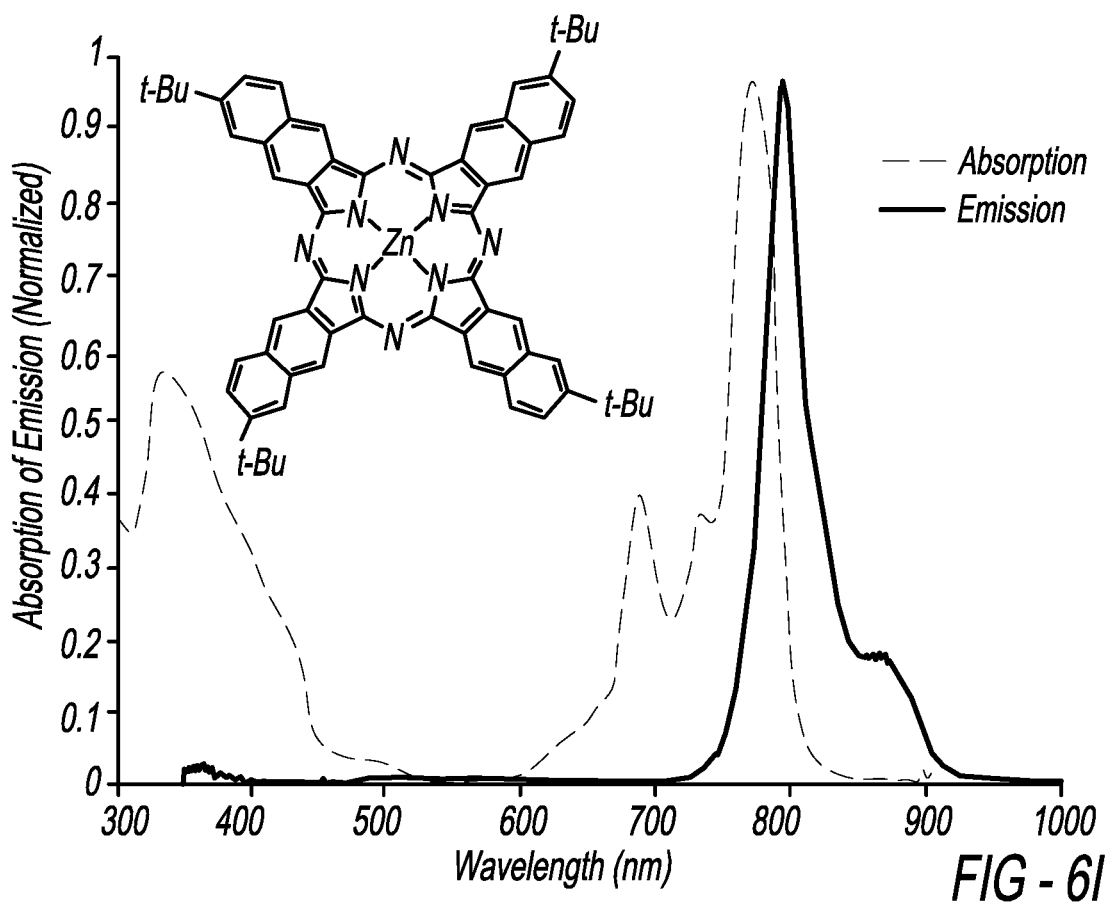
Figure 6J:
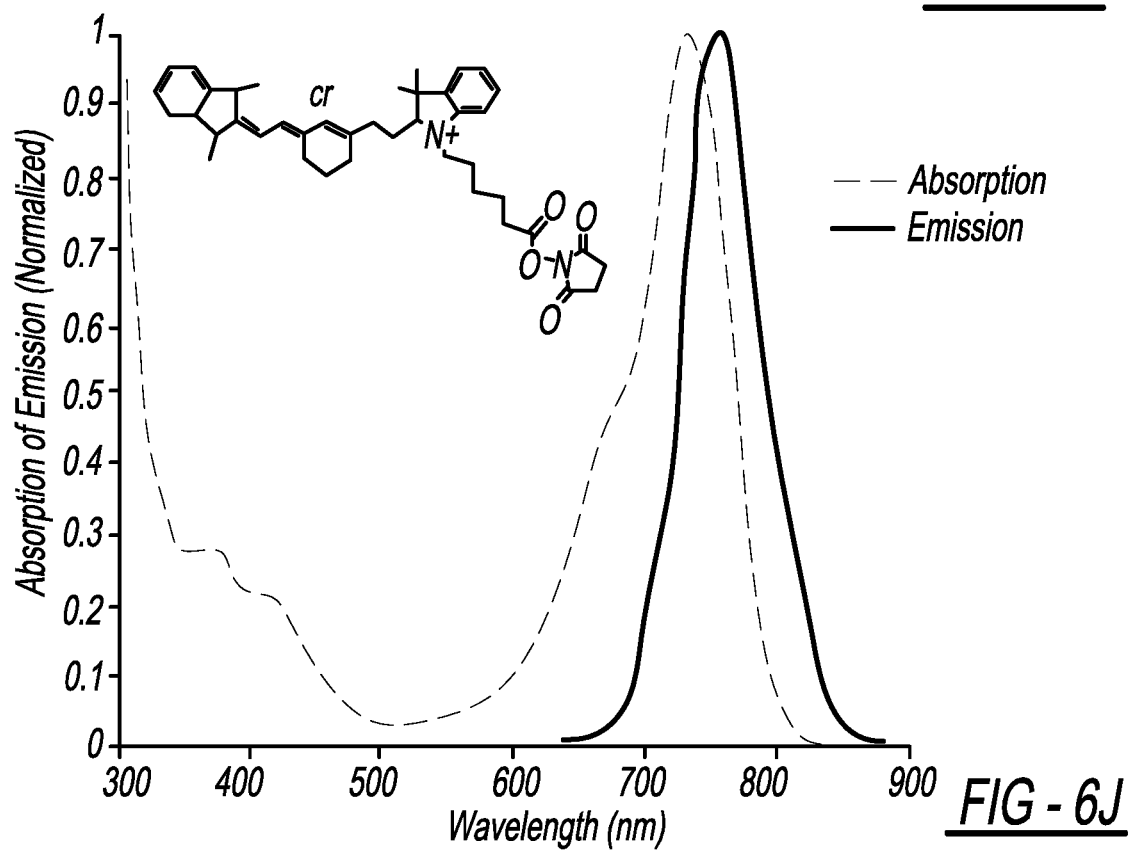

As shown in FIG. 5, a solar concentrator (SC) 500 can comprise a first wavelength-dependent mirror 505. The first wavelength-dependent mirror 505 can have a reflectivity of NIR light corresponding to only an emission spectrum of a waveguide redirecting material as shown in graph 550. Therefore, the first wavelength-dependent mirror 505 is transparent to visible light 510, but reflects NIR light 515 in an emission range shown in graph 550. The first wavelength-dependent mirror 505 can be functionally coupled to a first surface 520 of the SC 500, which comprises a waveguide redirecting material, such as a luminophore. Alternatively, the first wavelength-dependent mirror 505 can be functionally coupled to a second surface 525 of the SC 500, or to both surfaces 520, 525. In other embodiments, the waveguide redirecting material is on the second surface 525 or embedded within the waveguide.

With further reference to FIG. 5, the SC 500 can comprise a second wavelength-dependent mirror 530. The second wavelength-dependent mirror 530 can have a reflectivity of NIR light corresponding to both absorption and emission spectra of a waveguide redirecting material as shown in graph 560. The second wavelength-dependent mirror 530 is transparent to visible light 510, but reflects NIR light 515 in an emission range shown in graph 560. The second wavelength-dependent mirror can be functionally coupled to the first surface 520 of the SC 500, to the second surface 525 of the SC 500, or to both surfaces 520, 525. In a preferred embodiment, the first wavelength-dependent mirror is functionally coupled to the first surface 520 of the SC 500, and the second wavelength-dependent mirror is functionally coupled to the second surface 525 of the SC 500. As described above, a photovoltaic array can be positioned on the first surface 520, the second surface 525, or within the waveguide. In various embodiments, the SC 500 comprises a plurality of solar arrays positioned at any of the first surface 520, the second surface 525, or within the waveguide. In yet other embodiments, the SC 500 comprises a solar positioned at an edge of the SC 500 that is adjacent to the first and second surfaces 520, 525.

Incorporation of visibly transparent, selective NIR mirrors 505, 530 in transparent photovoltaics (TPVs) substantially improves power conversion efficiencies by 50-100%. Similarly, the incorporation of these mirrors improves the optical efficiency at low plate dimension by greater than about 20% while reducing the quantity of dye needed by half for a given optical density. For LSC sizes of greater than about 0.5 m², these mirrors are helpful in mitigating any surface and bulk scattering imperfections that could reduce system efficiencies. The mirrors can be coatings that improve collector absorption and increase waveguiding. Moreover, these coating layers are very similar to low-e-coatings that are already ubiquitously deployed and can complement or replace much of their functionality for heat rejection. Alternating layer combinations of $TiO_2$, $SiO_2$, and $Al_2O_3$ can be grown by e-beam evaporation, pulsed laser deposition, plasma-enhanced sputtering, thermal deposition, chemical vapor deposition, or solution deposition to optimize overall color impact and performance.

The scattering particles can be metal oxide clusters, metal nanoclusters, or both. The metal oxide clusters comprise metal oxides. Non-limiting examples of metal oxides include $TiO_2$, $SiO_2$, ZnO and $Al_2O_3$. Metal nanoclusters comprise metals that are suitable for scattering NIR light. Non-limiting examples of metals suitable for scattering NIR light include Ag, Au, Al, Cu, and Pt. The scattering particles can have a uniform size, or the size can vary to result in a particle size distribution.

The fluorescent or phosphorescent dyes comprise luminophores, which act as waveguide redirecting materials. As used herein, "luminophores" refers to inorganic or organic compounds that manifest luminescence, wherein the luminescence is fluorescence or phosphorescence. Luminophores that harness light in the NIR region of the electromagnetic spectrum are ideally suited for the present transparent systems. Individual luminophore performance is improved through combinations of chemical, purification, architecture, host-guest interactions and photon management with transparent NIR mirror design, and fabrication. Preferably, the luminophores absorb NIR light of wavelengths greater than about 650 nm. 650 nm is the wavelength of light at which human's begin to loose sensitivity to color perception (overall color rendering), as demonstrated by Lunt, "Theoretical Limits for Visibly Transparent Photovoltaics." Appl. Phys. Lett., 101, 043902, 2012, which is incorporated herein by reference in its entirety. More preferably, the luminophores absorb NIR light of wavelengths greater than about 700 nm, or wavelengths greater than about 800 nm. In various embodiments, the waveguide redirecting material is a visibly-transparent, NIR-absorbing, and NIR-emitting luminophore.

Cyanine dyes, cyanine salts, and naphthalocyanine derivatives are preferred NIR fluorophores. Derivatives of well-known dyes historically utilized in dye-lasers that have shown the highest relative stability include naphthalocyanine derivatives (i.e., analogous to the wavelength selective molecules previously exploited in transparent solar cells) and thiacarbocyanine salts with variable anion substitutability.

Thiacarbocyanine can be tailored through their alkene length (di, tri, tetra, etc.) to vary the electronic band gap (emission range). For a given bandgap, the quantum yield of these materials can be directly tailored through anion modification ($Cl^-$, $I^-$, $ClO_4^-$, etc.). Extended-conjugation molecule derivatives of phthalocyanines, phorphyrins, naphthalocyanines, carbon nanotubes, and small-gap polymers can be employed to cover a significant portion of the NIR spectrum with high quantum yields.

Preferred luminophores include 3,3'-diehtylthiacarbocyanine iodide (DTCI); 2-[7-(1,3-dihydro-1,3,3-trimethyl-2H-indol-2-ylidene)-1,3,5 heptatrienyl]-1,3,3-trimethyl-3H-indolium iodide (HITCI); 2-[2-[3-[[1,3-dihydro-1,1 dimethyl-3-(3-sulfopropyl)-2H-benz[e]indol-2-ylidene]-2-[4-(ethoxycarbonyl)-1 piperazinyl]-1-cyclopenten-1-yl] ethenyl]-1,1-dimethyl-3-(3-sulforpropyl)-1H benz[e] indolium hydroxide, inner salt, compound with n,n-diethylethanamine(1:1) (IR144); 2-[2-[2-Chloro-3-[(1,3-dihydro-3,3-dimethyl-1-propyl-2H-indol-2 ylidene) ethylidene]-1-cyclohexen-1-yl]ethenyl]-3,3-dimethyl-1-propylindolium iodide (IR780); aluminum 2,3-naphthalocyanine chloride (AlNc); silicon 2,3-naphthalocyanine dichloride (SiNc); 2-[2-[3-[(1,3-Dihydro-3,3-dimethyl-1-propyl-2H-indol-2-ylidene)ethylidene]-2-(phenylthio)-1-cyclohexen-1-yl]ethenyl]-3,3-dimethyl-1-propylindolium perchlorate (IR792); 5,5'-Dichloro-11-diphenylamino-3,3'-diethyl-10,12-ethylenethiatricarbocyanine perchlorate (IR140); zinc 2,11,20,29-tetra-tert-butyl-2,3-naphthalocyanine (ZnNc); 3-(6-(2,5-dioxopyrrolidin-1-yloxy)-6-oxohexyl)-1,1-dimethyl-2-((E)-2-((E)-3-((E)-2-(1,1,3-trimethyl-1H-benzo[e]indol-2 (3H)- ylidene)ethylidene)cyclohex-1-enyl)vinyl)-1H-benzo [e]indolium chloride (Cy7.5 NHS ester); 1-(6-((2,5-dioxopyrrolidin-1-yl)oxy)-6-oxohexyl)-3,3-dimethyl-2-((E)-2-((E)-3-((E)-2-(1,3,3-trimethyl-5-sulfonatoindolin-2-ylidene)ethylidene)cyclohex-1-en-1-yl)vinyl)-3H-indol-1-ium-5-sulfonate (sulfo-Cy7 NHS ester); 1-(6-(2,5-dioxopyrrolidin-1-yloxy)-6-oxohexyl)-3,3-dimethyl-2-((E)-2-((E)-3-((E)-2-(1,3,3-trimethylindolin-2-ylidene)ethylidene) cyclohex-1- enyl)vinyl)-3H-indolium chloride (Cy7 NHS ester; "CY"); 3-(6-(3-azidopropylamino)-6-oxohexyl)-1,1-dimethyl-2-((E)-2-((E)-3-((E)-2-(1,1,3-trimethyl-1H-benzo [e]indol-2(3H)-ylidene)ethylidene)cyclohex-1-enyl)vinyl)-1H-benzo[e]indolium chloride (Cy7.5 azide); 1-(5-carboxypentyl)-3,3-dimethyl-2-((E)-2((E)-3((E)-2-(1,3,3-trimethylindolin-2-ylidene)ethylidene)cyclohex-1-enyl) vinyl)-3H-indolium chloride (Cy7 azide); 1,1-dimethyl-3-(6-oxo-6-(prop-2-ynylamino)hexyl)-2-((1E,3E,5E)-5-(1,1, 3-trimethyl-1H-benzo[e]indol-2(3H)- ylidene)penta-1,3-dienyl)-1H-benzo[e]indolium chloride (Cy5.5 alkyne); 1-(6-(2-(2,5-dioxo-2,5-dihydro-1H-pyrrol-1-yl)ethylamino)-6-oxohexyl)-3,3-dimethyl-2-((E)-2-((E)-3-((E)-2-(1,3,3-trimethylindolin-2-ylidene)ethylidene)cyclohex-1-enyl)vinyl)-3H-indolium chloride (Cy7 maleimide); 3-(6-(2-(2,5-dioxo-2,5-dihydro-1H-pyrrol-1-yl)ethylamino)-6-oxohexyl)-1,1 -dimethyl-2-((E)-2-((E)-3-((E)-2-(1,1,3-trimethyl-1H-benzo[e]indol-2(3H)-ylidene)ethylidene) cyclohex-1-enyl)vinyl)-1H-benzo[e]indolium chloride (Cy7.5 maleimide); 1-(5-carboxypentyl)-3,3-dimethyl-2-((E)-2-((E)-3-((E)-2-(1,3,3-trimethylindolin-2-ylidene)ethylidene)cyclohex-1-enyl)vinyl)-3H- indolium chloride (Cy7 carboxylic acid); 1-Butyl-2-(2-(2-[3-[2-(1-butyl-3,3-dimethyl-1,3-dihydro-indol-2-ylidene)-ethylidene]-2-diphenylamino- cyclopent-1-enyl]-vinyl)-3,3-dimethyl-3H-indolium hexafluorophosphate; 1-Butyl-2-(2-[3-[2-(1-butyl-3,3-dimethyl-1,3-dihydro-indol-2-ylidene)-ethylidene]-2-phenyl-cyclopent-1-enyl]-vinyl)-3,3- dimethyl-3H-indolium hexafluorophosphate; 3-Ethyl-2-[3-[3-(3-ethyl-3H-benzothiazol-2-ylidene)-propenyl]-5,5-dimethyl-cyclohex-2-enylidenemethyl]-benzothiazol-3-ium iodide; 1-Butyl-2-(2-[3-[2-(1-butyl-3,3-dimethyl-1,3-dihydro-indol-2-ylidene)-ethylidene]-2-phenyl-cyclohex-1-enyl]-vinyl)-3,3-dimethyl-3H- indolium hexafluorophosphate; 1-Butyl-2-(2-[3-[2-(1-butyl-3,3-dimethyl-1,3-dihydro-indol-2-ylidene)-ethylidene]-2-phenyl-cyclohex-1-enyl]-vinyl)-3,3-dimethyl- 3H-indolium hexafluorophosphate; 3-Ethyl-2-[7-(3-ethyl-3H-benzothiazol-2-ylidene)-hepta-1,3,5-trienyl]-benzothiazolium iodide; 1-Butyl-2-[7-(1-butyl-3,3-dimethyl-1,3-dihydro-indol-2-ylidene)-hepta-1,3,5-trienyl]-3,3-dimethyl-3H-indolium hexafluorophosphate; 2-[3-Chloro-5-[1,1-dimethyl-3-(3-methyl-butyl)-1,3-dihydro-benzo[e]indol-2-ylidene]-penta-1,3-dienyl]-1,1-dimethyl-3-(3- methyl-butyl)-1H-benzo[e]indolium hexafluorophosphate; 2-[5-[1,1-Dimethyl-3-(3-methyl-butyl)-1,3-dihydro-benzo[e]indol-2-ylidene]-penta-1,3-dienyl]-1,1-dimethyl-3-(3-methyl-butyl)-1H-benzo[e]indolium hexafluorophosphate; 3,3-Dimethyl-2-[2-[2-chloro-3-[1,3-dihydro-3,3-dimethyl-5-sulfo-1-(4-sulfobutyl)-2H-indol-2-ylidene]-ethylidene]-1-cyclohexen-1-yl]-ethenyl]-5-sulfo-1-(4-sulfobutyl)-3H-indolium hydroxide, innersalt, trisodium salt; 2-[2-(3-[2-[3,3-Dimethyl-5-sulfo-1-(4-sulfobutyl)-1,3-dihydro-indol-2-ylidene]-ethylidene]-2-phenyl-cyclohex-1-enyl)-vinyl]-3,3-dimethyl-5-sulfo-1-(4-sulfobutyl)-3H-indolium hydroxide, inner salt, trisodium salt; 2-[5-[1,1-Dimethyl-3-(4-sulfobutyl)-1,3-dihydro-benzo[e]indol-2-ylidene]-penta-1,3-dienyl]-1,1-dimethyl-3-

(4-sulfobutyl)-1H-benzo[e]indolium hydroxide, inner salt, sodium salt; 2-(8-Hydroxy-1,1,7,7-tetramethyl-1,2,3,5,6,7-hexahydropyrido[3,2,1-ij]quinolin-9-yl)-4-(8-hydroxy-1,1,7,7-tetramethyl-2,3,6,7- tetrahydro-1H-pyrido[3,2,1-ij]quinolinium-9(5H)-ylidene)-3-oxocyclobut-1-enolate (squarylium); and combinations and mixtures thereof. FIGS. 6A-6J show absorbance and emission spectra for DTCI, HITC, IR144, IR170, AlNc, SiNc, IR792, IR140, ZnNc, and CY respectively. All of the spectra have emission and absorption peaks at a wavelength longer than about 650 nm.

As mentioned above, individual luminophore performance can be improved through combinations of chemical, purification, architecture, host-guest interactions and photon management with transparent NIR mirror design, and fabrication. Also, when thiacarbocyanine is the luminophore, the substituent alkene length can be varied to alter the emission range. Alternatively, the anions can be modified to improve the emission range. By these modifications, the quantum efficiency can be improved to about 50% or greater. In various embodiments, the quantum yield is greater than about 10-25%. Preferably, the quantum yield is greater than about 60%, or greater than about 70%, or greater than about 80%. Most preferably, the quantum yield is greater than about 90%.

A luminophore host is beneficial for: (1) physically separating molecules to increase quantum yields, (2) interacting directly and electronically with the molecules to increase or decrease quantum yields through polar interactions, and (3) encapsulating the chromophore to act as a barrier to air, moisture, and increase longevity. A PMMA derivative can, for example, enhance the quantum yield of several molecules from solution over a factor of two while allowing for negligible quantum yield reduction over three months in air. Moreover, luminophores can be readily and directly anchored to amine polymers such as poly(4-vinylpyridine), and polymers with pendent ammonium salt chains, synthesized from amine polymers or through direct polymerization.

This system results in a new energy pathway to renewable, low-carbon solar-energy deployment that can overcome many of the social and economic challenges associated with traditional PV technologies while improving building efficiency. This is achieved with domestically abundant materials including carbon based molecules, and nanoclusters composed of Br, Cl, C, Mo, N, O, Si, W, phthalic, and naphthalic acid, and thiatricarbocyanine derivatives (i.e., notable industrial metals) and no rare earth, radioactive, or precious metals (e.g., Pt, Ir, etc.).

The efficiency of a luminescent solar concentrator can be defined as:

$$\eta_{LSC} = \eta_{PV}^* \cdot (1-R) \cdot \eta_{abs} \cdot \frac{\eta_{PL}\eta_{trap}(1-\eta_{RA})}{1-\eta_{RA}\eta_{PL}\eta_{trap}}$$

where R is the front face reflection, $\eta_{abs}$ is the solar spectrum absorption efficiency of the luminophore, $\eta_{PL}$ is the luminescence efficiency of the luminophore, $\eta_{trap}$ is the waveguiding efficiency of the light, and $\eta_{RA}$ is the probability of reabsorption. The light trapping efficiency is $\eta_{trap} = \sqrt{1-1/n_{wav}^2}$. The PV efficiency (reported for AM1.5G) normalized by the solar spectrum absorption efficiency and the quantum efficiency at the luminophore wavelength is:

$$\eta_{PV}^* = \left(\frac{\eta_{PV}(AM1.5G)}{\eta_A(AM1.5G)}\right) \cdot \frac{\int \eta_{EQE}(\lambda)PL(\lambda)d\lambda}{\int PL(\lambda)d\lambda}$$

where $\eta_{EQE}$ is the external quantum efficiency, PL is the luminophore emission spectrum. The thermodynamic limiting $\eta_{PV}$ only accounts for Voc and FF losses. Because of the light dependence of $\eta_{PV}$, this correction will become dependent of the geometrical gain of the collector. For simplicity, it is assumed that the waveguided light flux remains close to 1-sun.

Reabsorption and forward emission losses can be estimated by:

$$\eta_{RA} = \frac{\int_0^\infty d\lambda \int_{\theta_{crit}}^{\pi/2} d\theta \int_{-\pi/4}^{-\pi/4} \sin(\theta)PL(\lambda)\left(1-\exp\left[-\varepsilon(\lambda)C\frac{Lt}{2t_0\sin(\theta)\cos(\phi)}\right]\right)d\phi}{\int_0^\infty d\lambda \int_{\theta_{crit}}^{\pi/2} d\theta \int_{-\pi/4}^{-\pi/4} \sin(\theta)PL(\lambda)d\phi}$$

where the critical angle (emission cone) is $\theta_{crit}=\sin^{-1}(1/n_{wave})$, $\varepsilon$ is the molar absorptivity, C is the concentration, L is the plate length, $\theta$ is azimuth relative to the normal of the LSC plane, and $\phi$ is the normal rotation coordinate. At moderate phosphor loading, the UV LSC can retain efficiencies beyond 10 m, which is larger than most typical windows. In contrast for the NIR emitters, the efficiency begins to "roll-off" at only 1-10 cm, defining the ideal embedded solar cell spacing.

With the present NLSCs, the short Stokes shift of the NIR harvesters is overcome through the solar cell implantation throughout a waveguide layer, concomitantly reducing overall optical losses, increasing solar absorption efficiency, and also increasing the cost. Moreover, the combination of NIR LSC luminophores with segmented PVs enhances the efficiency output over three fold for a range of high-levels of transparency over segmented PVs alone. Nonetheless, NIR designs are utilized as a platform for applications requiring high-efficiency, and high-CRI. Ultimately, these cells will be implemented with embedded solar cell "meshes" or thin-wafers allowing for the combination of high performance, and ideal aesthetic quality.

The energy harvesting devices are transparent or substantially transparent to a human viewer. The color rendering index (CRI) for the devices can be about 80 or higher. For example, the CRI can be about 80, about 85, about 90, about 95, about 99, or about 100. The average visible transmittance of the devices is greater than about 60%. In various embodiments, the average visible transmittance is greater than about 70%, greater than about 75%, greater than about 80%, greater than about 85%, or greater than about 90%. The efficiency of the energy harvesting devices can be greater than about 0.25%, greater than about 0.5%, greater than about 0.75%, greater than about 1.0%, greater than about 5%, or greater than about 10%. In various embodiments, the efficiency is from about 0.25% to about 10%. Therefore, the efficiency can be about 0.25%, about 0.5%, about 0.75%, about 1.0%, about 2.0%, about 3.0%, about 4.0%, about 5.0%, about 6.0%, about 7.0%, about 8.0%, about 9.0%, or about 10.0%. In some circumstances, the efficiency may be decreased in order to provide for a more transparent device. Therefore, in some embodiments, the efficiency may be aesthetically limited.

The present technology includes methods for preparing transparent energy harvesting devices. A solution containing a waveguide redirecting material, such as a scattering nanoparticle, a luminophore or a combination thereof, is mixed with a substrate solution to form a working solution. The substrate solution comprises (poly)-ethyl methacrylate (PEMA), an acetonitrile solution, (poly)-methyl methacrylate (PMMA) (poly)butyl methacrylate-co-methyl methacrylate (PBMMA), or combinations thereof, wherein the substrate solution is in a solvent. In a preferred embodiment, the substrate solution comprises PEMA, acetonitrile and PMMA in a ratio of 1:2:1. The working solution can be drop cast in a mold. Optionally, one or more photovoltaic solar cells can be placed within the working solution or on a surface of the working solution. The working solution is dried for several hours under flowing nitrogen to form a solid matrix. If the one or more photovoltaic solar cells were not placed within the working solution, one such solar cell can be attached to a surface of the matrix with nearly-indexed matched epoxy. Reflective coatings (mirrors) can be incorporated to the device by alternating layer combinations of $TiO_2$, $SiO_2$, and $Al_2O_3$ to optimize overall color impact and performance.

With this technology, panel characteristics are quickly adapted through large input-variable space (e.g., dye concentration, waveguide thickness, mirror integration, window dimension, etc.) around any of these output parameters. As a result, product performance can be tailored or customized to achieve the necessary combination of optical performance, power production and installed cost to match a variety of specifications for building designers looking to incorporate energy harvesting into the building skin. Additionally, this system can be seamlessly integrated into the building's electrical system. The generated electricity can then be stored locally and used as direct-current power or inverted to AC to supplement the building grid, capable of supplying a sizable portion of a building's perimeter zone electricity needs at the point of utilization.

As described above, the present technology provides for a light harvesting system that can be integrated into a building's window glass. However, the light harvesting system can also be layered over siding. Because the light harvesting system is transparent, it cannot be seen by a human viewer looking at the siding, whether the siding is on a house, vehicle, or a device. The light harvesting system can also be integrated into displays on television monitors, computer monitors, mobile devices, such as cell phones and media players, and signs, such as electronic billboards. The transparent nature of the light harvesting system allows it to be integrated into almost any device, vehicle, or building, that can benefit from harvesting power from the sun.

Embodiments of the present technology are further illustrated through the following non-limiting example.

EXAMPLE

NIR Harvesting TLSC

Experimental

Organic salt solution preparation: 2-[7-(1,3-dihydro-1,3,3-trimethyl-2H-indol-2-ylidene)-1,3,5-heptatrienyl]-1,3,3-trimethyl-3H-indolium iodide (HITCI) (Exciton) and 1-(6-(2,5-dioxopyrrolidin-1-yloxy)-6-oxohexyl)-3,3-dimethyl-2-((E)-2-((E)-3-((E)-2-(1,3,3 trimethylindolin-2-ylidene)ethylidene)cyclohex-1-enyl)vinyl)-3H-indolium chloride (CY) were characterized as received without further purification. Solutions for optical characterization were prepared by directly dissolving each compound in dichloromethane at various concentrations up to 4 mg/ml.

Optical characterization: Specular transmittance of both solutions and films was measured using a dual-beam Lambda 800 UV/VIS spectrometer in the transmission mode without the use of a reference sample. Emission spectra and quantum yields for various dyes were measured using a PTI QuantaMaster 40 spectrofluorometer with excitation at 730 nm (HITCI) and 700 nm (CY); quantum yield measurements were made using a calibrated integrating sphere attachment.

Module fabrication: A 5 mg/ml CY dichloromethane solution was mixed with (poly)-butyl methacrylate-co-methyl methacrylate (PBMMA) (Sigma-Aldrich) at a volume ratio of 1:1, yielding a target dye concentration (2 mg/mL) in the polymer composite film. To make luminescent solar cells (LSCs), this mixture was drop cast on 2 cm×2 cm×0.1 cm (for efficiency measurements) or 7 cm×7 cm×0.1 cm (for EQE measurements) square quartz or glass substrates (comprising four edges) and allowed to dry for 2 hours for each layer, and repeated 3 times, resulting in a layer thickness of approximately 1 mm. A laser-cut, 2 cm×0.1 cm Si cell (Narec Solar) with an efficiency of 15±1% @1 sun was attached with or without indexed matched epoxy to an edge of the waveguide. For EQE measurements, the other three edges were taped with black electrical tape to block edge reflection and simplify the geometric configuration. For power efficiency measurements, two cells were edge-mounted on orthogonal edges and connected in parallel. The remaining two edges were covered with enhanced specular reflector (Vikuiti, 3M). A thin border area around the LSC edges was masked to avoid any direct illumination of the LSC. Due to the illumination area of a solar simulator (67005 Xe arc lamp, Newport), plate lengths for power efficiency measurements were limited to less than about 0.05 m, and for EQE measurements, less than about 0.2 m.

Module Testing: Position-dependent EQE measurements were obtained by directing a monochromatic excitation beam from a fiber perpendicular to the LSC at various distances (d) from a single edge-mounted Si PV. The measured quantum efficiency was corrected by the factor, $g=\pi/\tan^{-1}(L/2d)$, that accounts for the different angle subtended by the solar cell at each spot distance, where L is the length of the edge of the LSC. The external quantum efficiency (EQE) was measured utilizing a Newport calibrated Si detector. Current density versus voltage (J-V) measurements were performed under simulated AM1.5G solar illumination corrected for solar spectrum mismatch.

Optical Modeling: A PV efficiency (reported for AM1.5G) is normalized by a solar spectrum absorption efficiency and a quantum efficiency at the luminophore wavelength. Reabsorption and forward emission losses were estimated with luminophore emission spectrum, molar absorptivity, concentration, LSC length, LSC system optical efficiency, and EQE were numerically evaluated in Matlab as a function of plate size, and luminophore concentration at fixed blend thicknesses.

Results

Figure 7A:
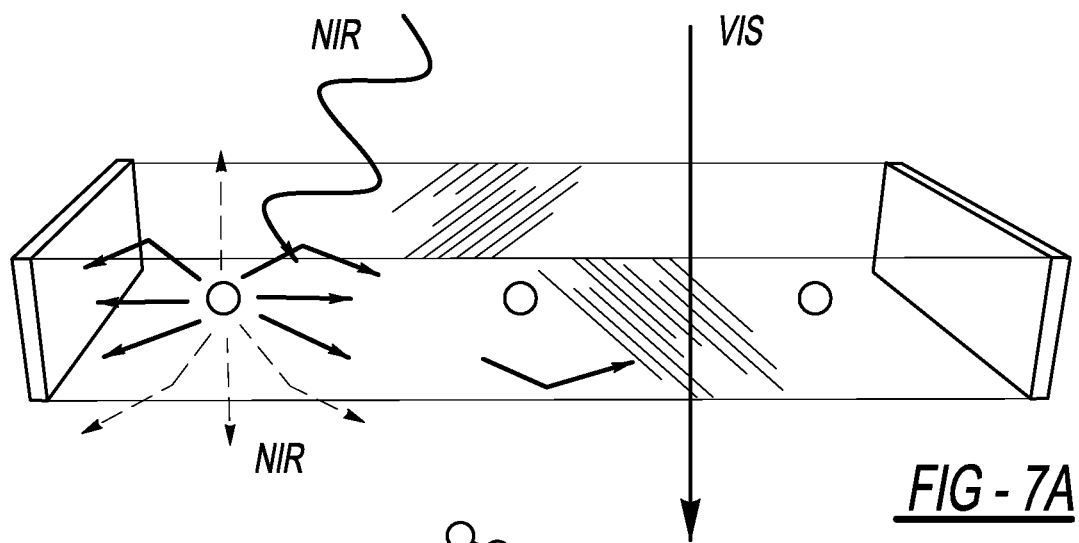
FIGS. 7A-7C show (7A) a schematic of a transparent luminescent solar concentrator; (7B) CY and HITC structures, and (7C) a photograph of a transparent LSC system incorporating CY dye highlighting the need for both absorption and emission outside the visible spectrum.
Figure 7B:
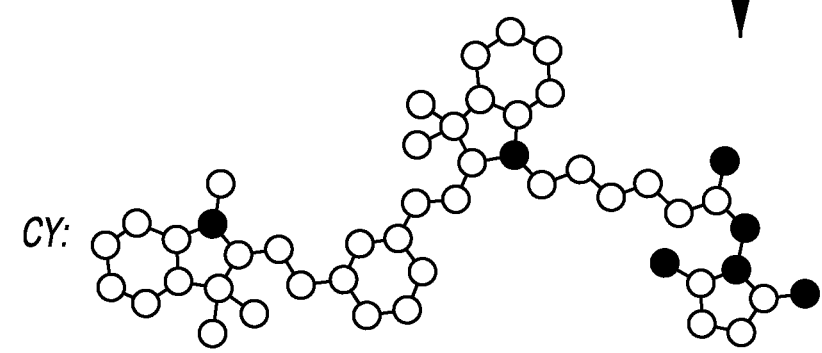
Figure 7B:
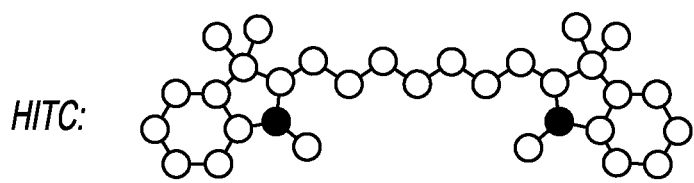
Figure 8A:
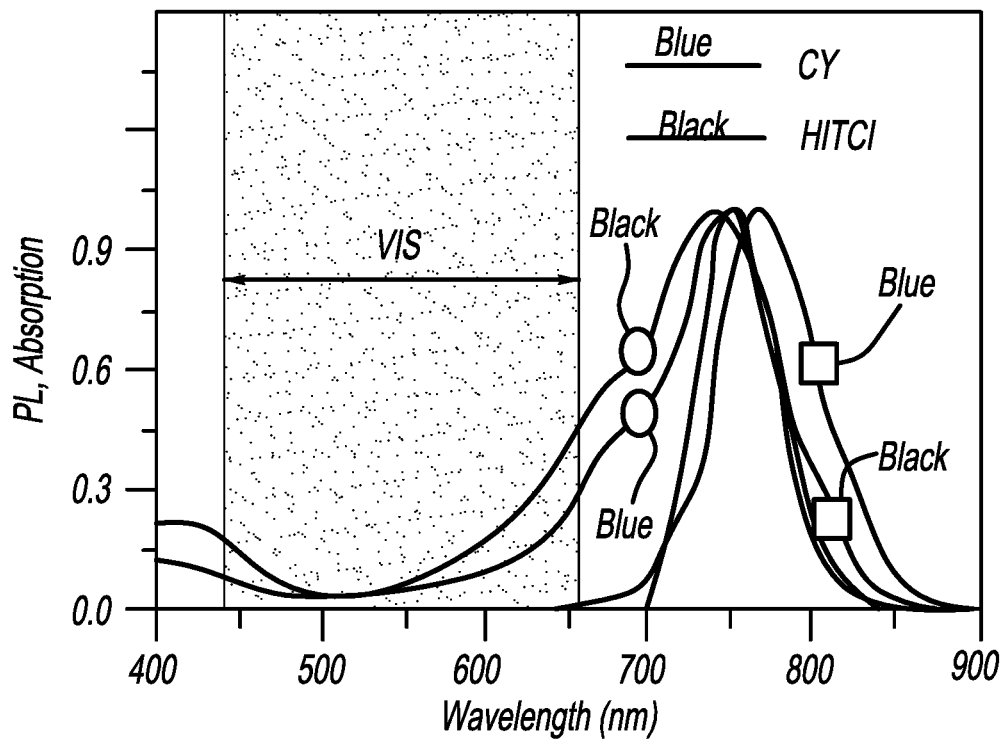
FIGS. 8A-8B show (8A) normalized absorption (circles) and emission (squares) spectra of the NIR absorbing luminophores CY and HITCI, and (8B) shows the measured quantum yield (QY) and absorption of CY and HITCI in dichloromethane as a function of concentration; solid lines are fits to Equation 1 for the QY and the Beer-Lambert law for absorption.

Two promising cyanine derivatives, 2-[7-(1,3-dihydro-1,3,3-trimethyl-2H-indol-2-ylidene)-1,3,5-heptatrienyl]-1,3,3-trimethyl-3H-indolium iodide (HITCI) and 1-(6-(2,5-dioxopyrrolidin-1-yloxy)-6-oxohexyl)-3,3-dimethyl-2-((E)-2-((E)-3-((E)-2-(1,3,3-trimethylindolin-2-ylidene)ethylidene)cyclohex-1- enyl)vinyl)-3H-indolium chloride (CY), were analyzed and the system was utilized to explore the impact of a Stokes shift. CY and HITCI molecular structures are shown in FIG. 7B. The absorption and emission spectra of the luminophores are shown in FIG. 8A. The absorption spectra peaks are at 742 nm for CY and 733 nm for HITCI with little visible absorption, and NIR emission peaks are at 772 and 753 nm for CY and HITCI, respectively. The Stokes shift, defined as the wavelength difference between the absorption and emission peaks, is 30 nm for CY and 20 nm for HITCI. The Stokes shift of the two materials helps demonstrate the difference in assembled LSC performance and is also an important parameter to predict large-area scalability.

Figure 7C:
Figure 8B:
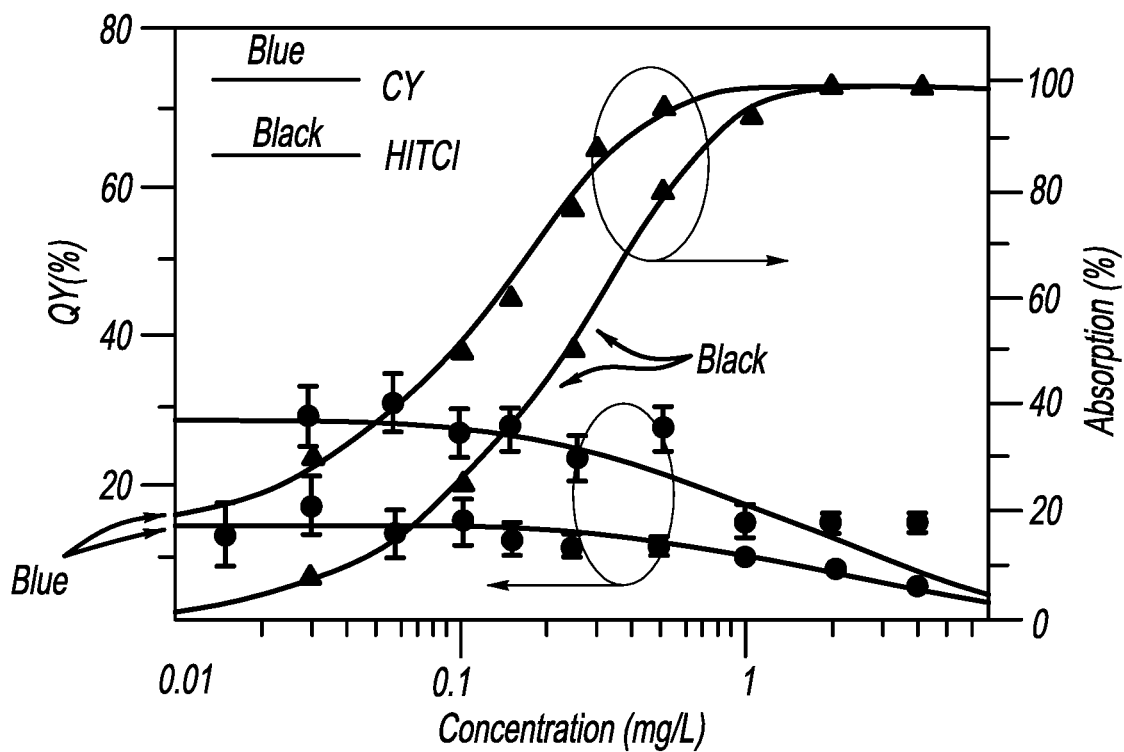

The luminescence quantum yield (QY) dependence on the concentration was explored to understand the photophysical behavior of these luminophores. The measured QY and absorption of CY and HITCI in dichloromethane solutions are shown in FIG. 8B as a function of dye concentration. The QY data of FIG. 8B was fit to a model with a concentration dependent non-radiate rate and the relationships between intrinsic non-radiative rate for isolated clusters $k_{nRo}$, rate for luminescence $k_R$, and concentration quenching scaling constant a were calculated. For CY, $k_{nRo}/k_R$=5.8, $a/k_R$=2.5 ml/mg, while for HITCI, $k_{nRo}/k_R$=2.5, $a/k_R$=2.2 ml/mg. The critical concentrations for CY and HITCI, defined here as the concentration where the QY is half of the maximum, are 2 mg/L and 1 mg/L, respectively. FIG. 7C shows the transparent LSC waveguide incorporating the CY luminophore. The spectrally resolved EQE of the overall LSC system of different plate sizes are shown in FIG. 3(c), which exhibits a peak at around 760 nm, matching the absorption spectrum and the calculated EQE in FIG. 9C. Shown in FIG. 9B is the current voltage characteristic of the 2 cm×2 cm×0.1 cm LSC system for the two edge mounted Si solar PVs (see Experimental section for details); the measured intensity dependence of the assembled CY LSC is shown in FIG. 9A, which is largely dependent of the intensity dependence of the edge mounted Si cells. The measured short circuit current density (Jsc) of the overall system under 1.0±0.1 sun was 1.2±0.1 mAcm$^{-2}$, with an open circuit voltage (Voc) of 0.50±0.01 V and a fill factor of 0.64±0.02 leading to an efficiency 0.38±0.05% for the CY luminophore. The calculated short circuit current density from integrating the product of the EQE and the AM1.5G solar spectrum, is 1.0±0.1 mAcm$^{-2}$, which is within error of the measured photocurrents. The corresponding average visible transmittance and color rendering index for the LSC system is 86%±1% and 94, respectively, compared to 90%±1% and 100 for the glass substrate alone and is slightly better in aesthetic quality to UV-only TLSCs.

FIG. 10 shows area-scaling calculations of optical efficiency of the CY LSC with modeled Stokes shift as a function of LSC length. When the Stokes shift (S) is below 30 nm, the critical plate length is around 1-2 cm while increasing the S can significantly increase the critical plate length to >1 m for S>100 nm. The information presented in FIG. 10 provides information for designing materials to improve scalability.

Discussion

Luminophore Photophysics

The individual non-radiative mode for the luminophores is larger than the radiative rates, leading to moderately-low quantum yields. This is true for many of the demonstrated NIR fluorophores and there continues to be a significant effort to improve QY in this spectral range for both medical applications and light emitting diodes. Here, the quantum yield decreases with increasing concentration due to excited state (non-radiative) quenching caused by particle-particle interactions at higher concentrations; these interactions persist even into dilute solutions. Accordingly, the concentrators designed herein utilize thicker layers of dilute concentrations to maintain both high quantum yield and high absorption efficiency, following the Beer-Lambert law. This criterion was utilized when beginning with a design concentration of 5 mg/L for a high quantum yield, and a molar absorption coefficient of 1.45×10$^8$ Lmol$^{-1}$m$^{-1}$ for Cy at 760 nm, leading to an optimal thicknesses of 1.0 mm for near complete NIR absorption. Also, a reduction in reabsorption losses is realized by utilizing thicker layers of dilute concentrations.

LSC Design

The efficiency of the transparent LSCs is governed by: solar spectrum absorption efficiency, luminophore photoluminescence efficiency waveguide (trapping) efficiency, transport (re-absorption) efficiency, and solar cell efficiency. The optical efficiency comprises waveguiding efficiency, transport efficiency, and luminescence efficiencies. Luminophore photoluminescence efficiency could be improved by employing higher quantum yield dyes or optimizing dye-polymer interactions to achieve higher quantum yields. Solar spectrum absorption efficiency can be improved by increasing dye concentration or by increasing blends thickness. However, there is a trade-off between quantum yield and concentration. Solar cell efficiency could be enhanced by utilizing solar cells with higher efficiency. Due to the monochromatic emission nature of the LSC, only single junction PVs can be attached around each individual LSC, which limits the overall system efficiency to less than the PV efficiency directly. It is also possible to stack complimentary transparent LSCs with different/absorption ranges on top of each other, whereby each LSC is individually coupled to their ideal PV. If less expensive higher bandgap cells (GaAs, and GaInP) become available, it could boost the efficiency for $\eta_{LSC}$ over 30% compared to Si, particularly for the LSCs demonstrated herein. However, for cost and availability considerations, lower-cost Si PVs with AM1.5G with a solar efficiency of 14-16% were utilized for the proof-of-principle demonstration described herein.

Reabsorption losses limit the performance of the LSCs fabricated in this work, due to the moderately low stokes shift for the dye. Indeed, it has long been recognized that a LSC's performance is often limited by reabsorption losses, particularly for dyes with modest S and larger plate sizes. The calculated optical efficiency in FIG. 10 shows that an increase of Stokes shift from 30 nm to 80 nm can improve the critical length, defined herein as the LSC length where the optical efficiency is half of the maximum, from 3 cm to 30 cm, where an LSC size of 30 cm is appropriate for many LSC applications. To fully maximize the large-area scaling of these devices, the design of high quantum-yield molecules with larger Stokes shift is favorable. However, there is a balance in considering the ideal Stoke shift. PVs are limited to those that have high quantum efficiency at the luminophore emission peak, but one also must consider maximizing the bandgap to minimize PV voltage losses. With Si PVs, the maximum Stoke shift is limited to less than about 200 nm with the expectation of harvesting a 200-300 nm slice of the NIR spectrum. For GaAs this maximum S is even more restricted.

One approach to obtain better scalability is by improving the quantum yield to closer to 100% through optimization of luminophore-host interactions and molecular design. For materials with QY close to 100%, each reabsorption event leads to another remission event, thereby reducing transport losses. However, it should be noted that each absorption/remission event appears as additional scattering because radiative emission is typically isotropic, and therefore would eventually lead to greater front/back-side losses for larger plate lengths. Another important approach to improve the scalability for low Stokes shift materials is to embed highly-segmented solar cell micro-arrays as meshes throughout the LSC waveguide to essentially create a series of "micro-LSCs," allowing for minimal reabsorption losses and additional contributions from the segmented PV. Considering these approaches, and by combining these LSCs with UV-TLSCs, efficiencies of greater than about 1% are readily achievable, and efficiencies approaching 10% are possible.

Conclusion

In conclusion, novel transparent luminescent solar concentrator devices comprising fluorescent organic salts, which selectively harvest NIR photons, have been designed and fabricated. The first visibly-transparent NIR-harvesting TLSC with a non-tinted transparency of 86%±1% in the visible spectrum combined with an efficiency of 0.4%±0.03% and potential for efficiencies up to 10% due to the large fraction of photon flux in the near-infrared has been demonstrated herein. The experiments and modeling show that the development of larger Stokes shift near-infrared luminophores, optimization of luminophore-host interactions, and fabrication of embedded segmented-PV configurations could reduce reabsorption losses and increase system efficiency over large areas. These transparent NIR LSCs provide an entirely new route to transparent light-harvesting systems with tremendous potential for high defect tolerances and processability.

What is claimed is:

1. An energy harvesting system comprising:
   a waveguide including a top surface, a bottom surface, and an edge surface, the waveguide configured to receive sunlight through the top surface, the bottom surface, or both the top surface and the bottom surface;
   a luminophore embedded in or disposed on the waveguide, the luminophore being a cyanine or salt thereof, a squarylium, a carbon nanotube, a thiacarbocyanine or salt thereof, a naphthalocyanine or derivative thereof, a phthalocyanine or derivative thereof, a phorphyrin, or a combination thereof; and
   a segmented solar photovoltaic array disposed onto a top surface of the waveguide, disposed onto a bottom surface of the waveguide, or embedded within the waveguide,
   wherein the energy harvesting system is visibly transparent, having an average visible transmittance of sunlight of greater than about 50% and a color rendering index of sunlight of greater than about 80 referenced to the AM1.5G spectrum at normal incidence to the waveguide.

2. The energy harvesting system according to claim 1, wherein the luminophore has a strongest peak absorbance of light at a wavelength of greater than about 650 nm and a strongest peak emission of light at a wavelength of greater than about 650 nm.

3. The energy harvesting system according to claim 2, wherein the luminophore has no peak absorption in the visible spectrum.

4. The energy harvesting system according to claim 2, wherein the luminophore has a second strongest peak absorbance of light at a wavelength of less than about 450 nm.

5. The energy harvesting system according to claim 1, comprising a plurality of luminophores, wherein each luminophore of the plurality has a strongest peak emission of light at a wavelength of greater than about 650 nm.

6. The energy harvesting system according to claim 1, wherein the energy harvesting system has an average visible transmittance of greater than about 70% and a color rendering index of greater than about 85 at normal incidence to the waveguide.

7. The energy harvesting system according to claim 1, wherein the color rendering index of greater than about 80 is in regard to a reference spectrum of sunlight.

8. The energy harvesting system according to claim 1, wherein the luminophore has a quantum yield of luminescence of greater than about 20%.

9. The energy harvesting system according to claim 1, further comprising:
   a first wavelength-selective mirror coupled to a first surface of the waveguide, the first wavelength-selective mirror being transparent to visible light and reflective to NIR light; and optionally
   a second wavelength-selective mirror coupled to an opposing second surface of the waveguide, the second wavelength-selective mirror being transparent to visible light and reflective to NIR light.

10. The energy harvesting system according to claim 1, wherein the energy harvesting system is configured as a window for a building, a greenhouse, an automotive vehicle, an aircraft, or a watercraft.

11. The energy harvesting system according to claim 1, wherein the energy harvesting system is configured as a window for a building and is integrated into the building's electrical system.

12. The energy harvesting system according to claim 1, wherein the system is integrated into a display on a monitor, a mobile device, or a billboard.

13. A method of constructing a building or an automotive vehicle, the method comprising:
   incorporating the light harvesting system according to claim 1 into a building structure to form the building or into an automotive vehicle body to form the automotive vehicle.

14. An energy harvesting system comprising:
   a waveguide comprising a visibly transparent glass or plastic, the waveguide including a top surface, a bottom surface, and an edge surface, the waveguide configured to receive sunlight through the top surface, the bottom surface, or both the top surface and the bottom;
   a luminophore embedded in or disposed on the waveguide, the luminophore having a strongest peak absorbance of light at a wavelength of greater than about 650 nm, a strongest peak emission of light at a wavelength of greater than about 650 nm, and no peak absorption of light in the visible spectrum, the luminophore being a cyanine or salt thereof, a squarylium, a carbon nanotube, a thiacarbocyanine or salt thereof, a naphthalocyanine or derivative thereof, a phthalocyanine or derivative thereof, a phorphyrin, or a combination; and
   a segmented solar photovoltaic array disposed on a top surface of the waveguide, disposed on a bottom surface of the waveguide, or embedded within the waveguide,
   wherein the energy harvesting system is visibly transparent, having an average visible transmittance of sunlight of greater than about 50% and a color rendering index of sunlight of greater than about 80 referenced to the AM1.5G spectrum at normal incidence to the waveguide.

15. The energy harvesting system according to claim 14, wherein the luminophore has a quantum yield of luminescence of greater than about 20%.

16. An energy harvesting system comprising:

a waveguide comprising a visibly transparent glass or plastic;

a luminophore embedded in the waveguide, the luminophore having a strongest peak absorbance of light at a wavelength of greater than about 650 nm, a strongest peak emission of light at a wavelength of greater than about 650 nm, and no peak absorption of light in the visible spectrum, the luminophore being a squarylium, a carbon nanotube, a thiacarbocyanine or salt thereof, a naphthalocyanine or derivative thereof, a phthalocyanine or derivative thereof, or a combination thereof; and a solar photovoltaic cell coupled to an edge of the waveguide, wherein the energy harvesting system is visibly transparent, having an average visible transmittance of sunlight of greater than about 50% and a color rendering index of sunlight of greater than about 80 referenced to the AM1.5G spectrum at normal incidence to the waveguide.

17. The energy harvesting system according to claim 1, wherein the luminophore has a strongest peak absorbance of light at a wavelength of greater than about 650 nm and less than about 1000 nm and the luminophore has a strongest peak emission of light at a wavelength of greater than about 650 nm and less than about 1000 nm.

18. The energy harvesting system according to claim 1, wherein the average visible transmittance of sunlight is less than 90%.

19. The energy harvesting system according to claim 1, wherein the luminophore includes a blend of a cyanine or salt thereof and a squarylium.

20. The energy harvesting system according to claim 1, wherein the luminophore includes a thiacarbocyanine or salt thereof, a naphthalocyanine or derivative thereof, a phthalocyanine or derivative thereof, or a combination thereof.

* * * * *